(12) United States Patent
Cerio, Jr.

(10) Patent No.: US 7,618,888 B2
(45) Date of Patent: Nov. 17, 2009

(54) TEMPERATURE-CONTROLLED METALLIC DRY-FILL PROCESS

(75) Inventor: Frank M. Cerio, Jr., Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 332 days.

(21) Appl. No.: 11/389,511

(22) Filed: Mar. 24, 2006

(65) Prior Publication Data
US 2007/0224793 A1  Sep. 27, 2007

(51) Int. Cl.
*H01L 21/4763* (2006.01)

(52) U.S. Cl. ........................ 438/629; 438/625

(58) Field of Classification Search ........... 438/629
See application file for complete search history.

(56) References Cited

U.S. PATENT DOCUMENTS

| 6,080,287 | A | 6/2000 | Drewery et al. |
|---|---|---|---|
| 6,132,564 | A | 10/2000 | Licata |
| 6,197,165 | B1 | 3/2001 | Drewery et al. |
| 6,268,284 | B1 * | 7/2001 | Cerio, Jr. .................... 438/643 |
| 6,287,435 | B1 * | 9/2001 | Drewery et al. ........ 204/298.09 |
| 6,373,135 | B1 * | 4/2002 | Weber ......................... 257/758 |
| 6,755,945 | B2 * | 6/2004 | Yasar et al. ............... 204/192.3 |
| 7,141,763 | B2 * | 11/2006 | Moroz ......................... 219/390 |
| 7,348,266 | B2 * | 3/2008 | Cerio, Jr. .................... 438/586 |
| 2003/0034244 | A1 | 2/2003 | Yasar et al. |
| 2004/0188239 | A1 | 9/2004 | Robison et al. |

FOREIGN PATENT DOCUMENTS

WO   WO2004088732   * 10/2004

* cited by examiner

*Primary Examiner*—N Drew Richards
*Assistant Examiner*—Grant S Withers
(74) *Attorney, Agent, or Firm*—Wood, Herron & Evans, L.L.P.

(57) ABSTRACT

A method for performing ionized physical vapor deposition (iPVD) is described, whereby the substrate temperature can be rapidly changed to control a metal deposition process and increase the quality of the metal deposited. In one embodiment, a copper deposition process can be performed.

4 Claims, 9 Drawing Sheets

TEMPERATURE-CONTROLLED METALLIC DRY-FILL PROCESS

This application is related to commonly assigned and co-pending U.S. Patent Application Publication No. 20030034244, and U.S. patent application Ser. Nos. 11/241,741 and 11/241,722, both filed on Sep. 30, 2005, all hereby expressly incorporated herein by reference.

FIELD OF THE INVENTION

The invention relates to the metallization of via and trench structures on semiconductor substrates. More particularly, the invention relates to the dry filling of high aspect ratio via and trench structures of silicon substrates utilizing ionized metallic materials.

BACKGROUND OF THE INVENTION

In the metallization of high aspect ratio vias and trenches on semiconductor substrates, it is required that the barrier and seed layer have good sidewall coverage. It is also important to have a void-free metal deposition.

Ionized PVD deposition is used for barrier and seed layer metallization in advanced IC substrates. Ionized PVD provides good sidewall and bottom coverage in via and trench structures. However, as the geometries shrink and as the via dimensions go down below 0.15 micrometers, ionized deposition requirements become more critical. Therefore, it is highly desirable to have an ionized PVD process where bottom and sidewall coverage are well balanced and overhang is minimized.

Accordingly, there is a need to further control the quality of the metal deposited in high aspect ratio vias and trenches during the deposition step.

In accordance with certain embodiments of the invention, establishing a second substrate temperature is achieved by rapidly changing the temperature of the substrate holder. The establishing of the second substrate temperature, for example, can occur within a time interval equal to that of the first shutdown time. This can be achieved by use of a fast-reacting heating assembly coupled to the substrate holder and a control unit coupled to the fast-reacting heating assembly.

SUMMARY OF THE INVENTION

The invention provides a method of filling a plurality of ultra-small (nano-sized) features using a deposition system that includes a processing chamber, a gas supply system coupled to the processing chamber, an inductively coupled plasma (ICP) source coupled to the processing chamber, a metallic target coupled to the processing chamber, a DC source coupled to the metallic target, a substrate holder coupled to the processing chamber, a substrate holder including a fast reacting heater, a RF bias generator coupled to the substrate holder, and a backside gas supply system coupled to the substrate holder. The method includes positioning a patterned substrate on substrate holder in a processing chamber; establishing a first substrate temperature; exposing the patterned substrate to a first dry-filling plasma during a first dry-filling time; extinguishing the first dry-filling plasma during a first shutdown time; establishing a second substrate temperature; exposing the patterned substrate to a second dry-filling plasma during a second dry-filling time; extinguishing the second dry-filling plasma during a second shutdown time; and removing the patterned substrate from the processing chamber.

BRIEF DESCRIPTION OF THE DRAWINGS

A more complete understanding of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 1A:
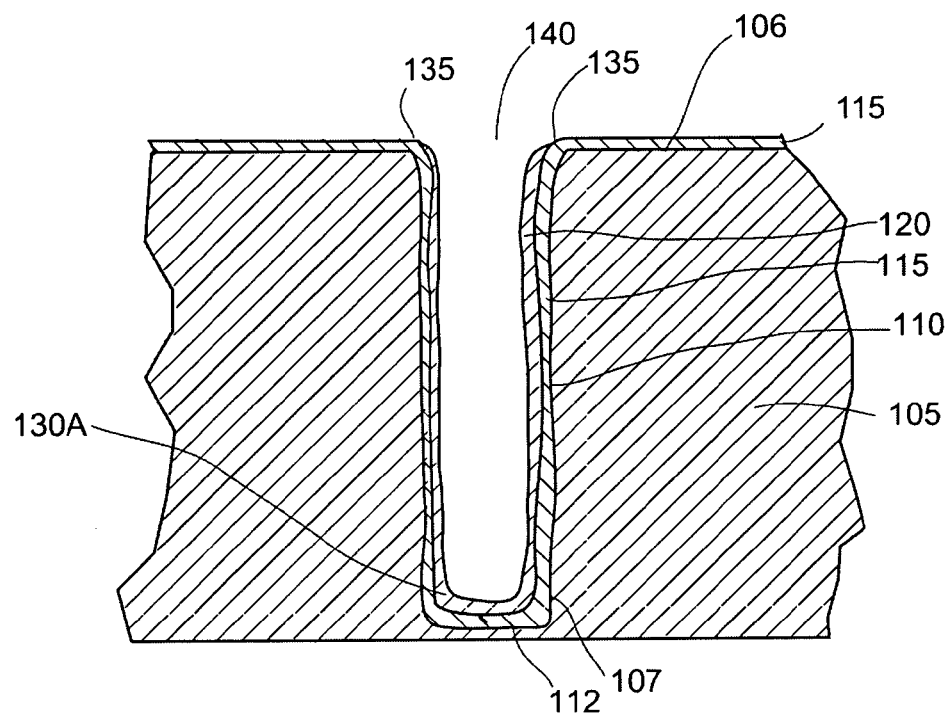
FIGS. 1A-1C illustrate a simplified view of a dry-filling process in accordance with an embodiment of the invention.

A process is described in U.S. Patent Application Publication No. 20030034244 by Yasar et al., which is co-pending and assigned to the assignee of the present application, which provides ionized PVD with sequential deposition and etching. While with this type of sequencing the overhang or overburden are much improved over prior processes, some will still form during the deposition sequence and may not be entirely removed in the etch sequence when the substrate includes nano-sized (ultra-small) features. For example, nano-sized features may have critical dimensions less than 100 nm and depths greater than 250 nm.

Yasar et al. describe a technique to deposit and etch multiple times within a single vacuum chamber. Overhangs and field deposition are not fundamentally controlled within the deposition step of this process. Higher bias powers are typically used in the deposition step to deposit as much bottom coverage as possible before etching back the bottom to redistribute material to the sidewalls and reduce the bottom coverage, which can add to line resistance. Reduction of overhang and field deposition is achieved in the subsequent etch steps.

The invention provides a method of operating an ionized physical vapor deposition (iPVD) system to deposit metallic material into nano-sized features on a patterned substrate on a substrate holder within a processing chamber. The method can include a No Net Deposition (NND) process, where the process parameters are adjusted to cause the net deposition rate to be approximately zero in the field area of the patterned substrate. The iPVD system may also be used to deposit metallic material using a Low Net Deposition (LND) process, where the process parameters are adjusted to establish an ultra-low deposition rate in a field area of the patterned substrate.

The field area refers to the upper surface of the substrate being processed and is the surface into which the nano-sized features, such as high aspect ratio vias and trenches, extend.

An ultra-low deposition rate as referred to herein is a deposition rate of less than about 30 nanometers per minute.

An iPVD processing system can be used for the LND and NND processes. These processes can be typically performed in the vacuum processing chamber of an iPVD apparatus in which the substrate to be processed is held on a support. A high-density plasma is maintained in the chamber in a processing gas, which can be, for example, an inert gas into which metal or other filling material has been introduced, usually by sputtering from a target. The high-density plasma can be ionized by coupling RF energy into the process gas, often by an inductive coupling from outside of the chamber. The RF energy ionizes both the process gas and a fraction of the dry-filling material, which may be to a low plasma potential of only a few volts, but may be higher. The processing gas and the ionized dry-filling material can then be directed onto the substrate to fill the nano-sized features on the substrate. For the dry-filling processes of the present invention, an iPVD process can be used. The parameters of the iPVD process are controlled to produce a substantially uniform fill across the surface of the substrate with substantially no deposition in the field area of the substrate. When so controlled, the iPVD process produces the desired result of back filling without producing overhangs around the feature openings. Alternatively, an iPVD process may not be required.

Exemplary embodiments of the method of the invention are described below, which disclose dry-filling techniques for use with an iPVD system to metallize high aspect ratio vias and trenches by depositing ionized metal. In one example, substrate processing may include depositing a thin layer of a barrier metal, depositing a metallic seed layer, and the dry filling with a metal such as Cu. In another example, substrate processing may include depositing a thin layer of a barrier metal, and the dry filling with a metal such as Cu.

This invention is distinctly different from prior art which teaches high DC powers with high RF bias powers for increased conformality or the case where several deposition and etch steps are performed within or in different vacuum chambers. This process is characterized by very low deposition rates in the field area of the substrate and substantially larger deposition rates into the nano-sized features of the substrate. For example, the DC power can be reduced to reduce the deposition rate to less than 10 nm/min. In addition, the invention is different because a substrate holder of the present invention includes a substrate heater assembly having a low thermal mass and a fast response time. Additionally, means for controlling the backside pressure applied to the substrate are provided.

In addition, other deposition techniques use electro-plating processes. The self-annealing of electroplated (EP) films, lines, and/or vias has provided manufacturing issues such as reliability and reproducibility problems because of changes in the grain size and hardness of the deposited copper.

The present invention eliminates the problems associated with the electro-plating techniques. The dry-filling processes described herein have the capability to fill nano-sized features of the patterned substrate in a bottom-up manner without producing voids and without depositing a significant amount of material in the field area of the patterned substrate.

Figure 1B:
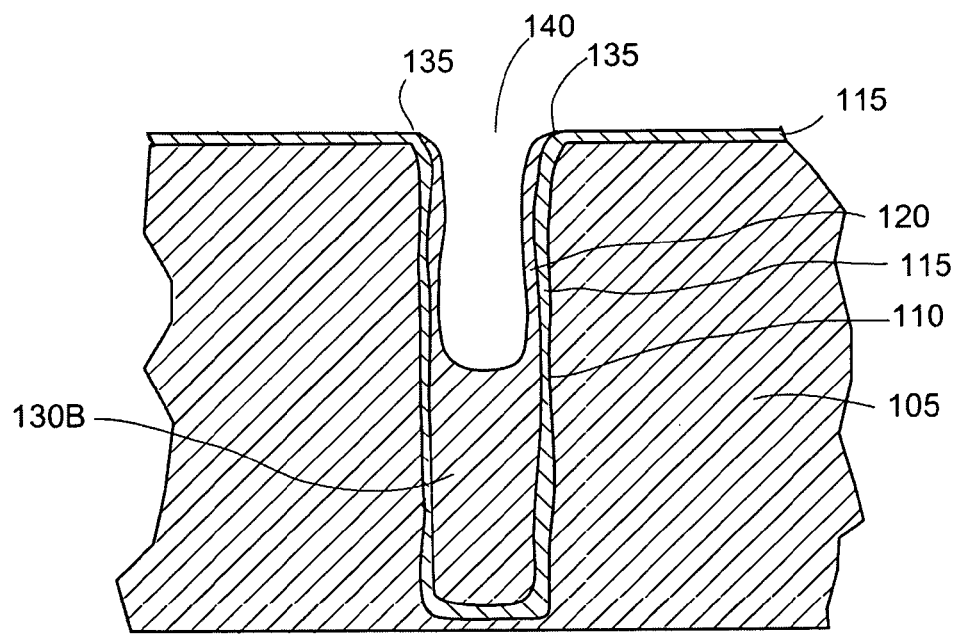
Figure 1C:
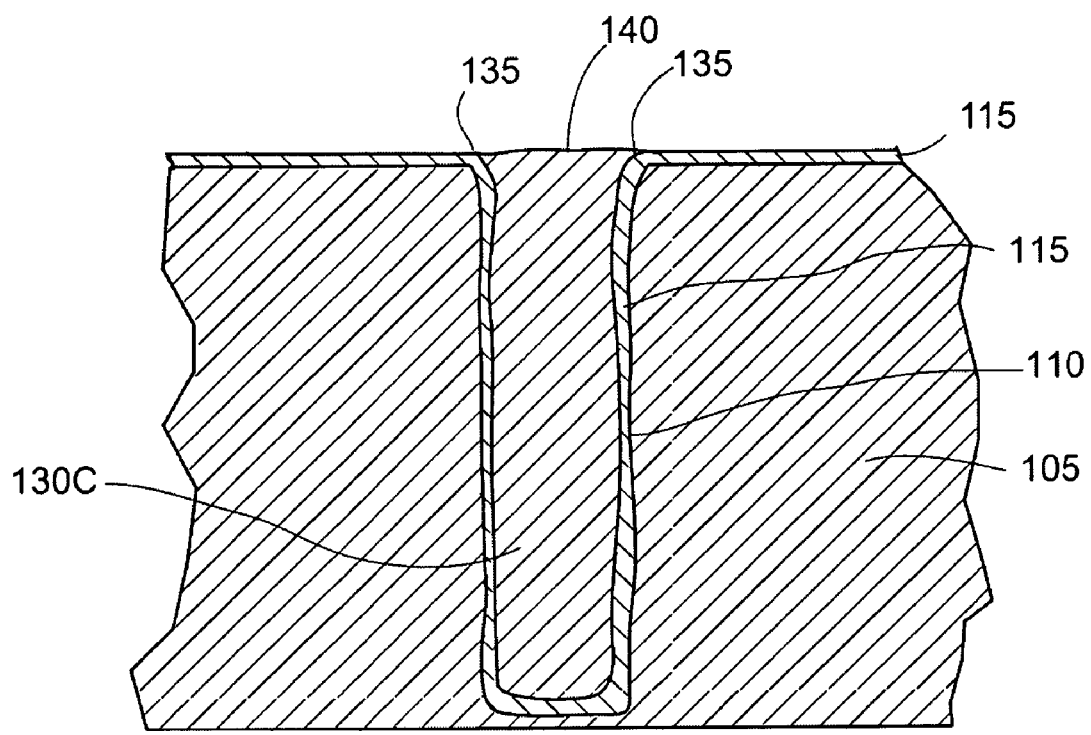

FIGS. 1A-1C illustrate a simplified view of a dry-filling process in accordance with an embodiment of the invention. In the illustrated embodiment, a three-step process is shown, but this is not required for the invention. Alternatively, a different number of steps may be used.

In FIG. 1A, a simplified cross-section is shown for a substrate 105 and a feature structure 110 that can represent a trench or a via. In the illustrated embodiment, a single feature is shown, but this is for illustration purposes only.

A barrier layer 115 is shown on the top surface 106 of the substrate 105, the sidewall surface 111 of the feature 110, and the bottom surface 112 of the feature 110. In addition, a seed layer 120 is shown on top of the barrier layer 115 on the sidewall surface 111 of the feature 110, and on the bottom surface 112 of the feature 110 of the surface.

In the illustrated embodiment shown in FIG. 1A, a first portion of material 130A is shown in the bottom portion of the feature. For example, the first portion of material 130A can be deposited during a first dry-filling process. Alternatively, this first portion can be deposited during a seed layer deposition.

The barrier and seed layer have substantially uniform coverage along the high aspect-ratio feature sidewall surfaces, and have minimum overhang 135 at the top opening 140 of the features. The barrier/seed layers can comprise sputtered Ta/TaN. It is well known that TaN has good adhesion to $SiO_2$-based substrates and tantalum has good adhesion to copper that can help to reduce copper migration along grain boundaries and stress-induced voiding. In addition, α-tantalum has a lower resistivity and helps with the formation of low-resistivity copper having a (111) orientation in the high aspect ratio features during a dry-filling process.

The inventor believes that the texture of the seed layer plays a role in the development of the texture of the copper deposited during the dry-filling process. It is believed that a larger grain size in the seed layer will result in a larger grain size in the deposited material. In addition, the inventor believes that the texture of the seed layer copper is important since the texture of the dry-filled copper will be similar to the texture of seed layer copper. The inventor believes that the (111) texture is desirable.

In FIG. 1B, a simplified cross-section is shown for a substrate 105 and a feature structure 110 that can represent a trench or a via. In the illustrated embodiment, a single feature is shown, but this is for illustration purposes only.

A barrier layer 115 is shown on the top surface 106 of the substrate 105, the sidewall surface 111 of the feature 110, and the bottom surface 112 of the feature 110. In addition, a seed layer 120 is shown on top of the barrier layer 115 on the sidewall surface 111 of the feature 110, and on the bottom surface 112 of the feature 110 of the surface.

In the illustrated embodiment shown in FIG. 1B, an additional portion of material 130B is shown in the lower portion of the feature. For example, the additional portion of material 130B can be deposited during a second dry-filling process. Alternatively, the deposited amount can be different and one or more dry-filling processes may be performed. In addition, the sidewall coverage remains uniform, the feature opening 140 remains substantially unrestricted, and the overhang 135 continues to be minimized.

In FIG. 1C, a simplified cross-section of a completely filled feature 115 is shown for a substrate 105 and a feature structure 110 that can represent a trench or a via. In the illustrated embodiment, a single feature is shown, but this is for illustration purposes only. A barrier layer 115 is shown on the top surface 106 of the substrate 105, the sidewall surface 111 of the feature 110, and the bottom surface 112 of the feature 110.

In the illustrated embodiment shown in FIG. 1C, a third portion of material 130C fills the feature 115. For example, the third portion of material 130C can be deposited during one or more dry-filling processes. Alternatively, the deposited amount can be different and the feature can be overfilled or under-filled. During a dry-filling process, the feature 115 has been filled in a bottom-up manner without voids.

Copper can crystallize into a number of different structures. For example, a single copper crystal can have a face centered cubic structure with four Cu atoms per three unit cell and a lattice parameter equal to 0.361 nm that yields a density of 8.92 g/cm. Deposited crystalline materials such as thin films of Cu, can contain defects such as: point defects, dislocations, grain boundaries, interfaces, voids, and inclusions, and the defects are extremely important when examining the quality and functionality of the thin films. For example, chemical, electrical, and mechanical properties can be altered by the presence of defects. In addition, the properties of crystalline materials are not isotropic but depend on a specific direction in the lattice. For example, in bulk materials isotropic behavior can be assumed when the individual Cu crystals are oriented throughout a piece of bulk material with equal directional probability, and the material's properties can be assumed isotropic and can be averaged over the entire sample. When considering thin films, structure/texture can lead to non-isotropic behavior, and structure/texture can be assumed to be the tendency of the individual crystals of a material to assume a preferred crystallographic orientation. For example, structure/texture can affect the oxidation process, film resistivity, and surface energy properties.

When material is deposited using different deposition techniques the structure/texture can be different. Material deposited in the seed layer typically has a different structure than the material deposited during a dry-filling process. For example, the dry-filled copper can have a larger grain sizes and larger grain boundary areas than the seed layer copper.

Typically, materials with grain boundaries try to reduce the grain boundary area using grain growth. Grain growth can be driven by forces such as grain boundary energy reduction, surface and interface energy reduction, and strain energy reduction. For example, the smaller the grain size leads to a larger the driving force.

It is well known that copper has anisotropic mechanical characteristics. The surface energy is lowest in the (111) texture, whereas the strain energy is lowered in the (200) texture. Further understanding of grain structure evolution in the copper deposited during the dry-filled process is being developed.

Because different substrate temperatures are used during different dry-filling processes, the driving forces for grain growth can be different during different portions of the process. For example, at lower substrate temperatures, the stress may be low and surface energy may dominate. In this case, the deposited material may prefer a texture that minimizes the surface energy, that is (111) texture. At higher substrate temperatures, the deposited material may be under compressive stress, and grain growth will occur to minimize the strain energy.

The dry-filling procedures, as described herein, can be used to deposit ultra-thin films and/or fill nano-sized features such as trenches and vias. The features can include Damascene structures. Because of the temperature variations during the dry-filling processes, the final grain structures and textures of the films, lines, and vias will depend on the critical balance between surface energy and strain energy. For example, when examining trenches and/or vias, the stress condition and surface energy will be quite different due to the confinement of the trench and/or via sidewalls. In addition, the final grain structure is an important factor that determines long-term reliability of trenches and/or vias.

In addition, some copper interconnections have suffered from early failures that severely reduce the effective lifetime of the semiconductor deices, and some of these failures have been attributed to electro-migration. The grain structure/texture is known to be a factor that affects electro-migration. For example, lines and/or vias with well aligned (111) texture may be more resistant to electro-migration than those with poorly aligned or (100) texture.

Some prior art deposition methods provide incomplete and/or non-uniform deposition in small features. For example, an incomplete and/or non-uniform deposition may leave a void or a seam line that includes ultra-small voids, and later in the fabrication processes, these voids may begin to grow. The inventors believe that the dry-filling procedures described herein can substantially eliminate the electro-migration problems by providing a bottom-up filling process that results in void-free and seam-free material.

Copper interconnects using dual damascene structure can significantly reduce the interconnect resistance and improve the interconnect electro-migration performance. In general, there are three different ways to form a dual damascene structure, i.e. line first, via first, and self-align. The dry-filling procedures described herein can be used for structures created using the three different approaches.

The present invention provides a dry-filling method for depositing copper into nano-sized features that is better than the currently used electroplating (wet) techniques. For example, electroplated copper films are known to have "self-annealing" problems. In addition, the dry-filling process has an advantage over other conventional processes such as physical (PVD) or chemical vapor deposition (CVD) techniques.

In the prior art processes, a CMP process is often used to remove excess material after a deposition process. The CMP process can lead to uniformity problems, contamination issues, and decreases in throughput.

In one embodiment, a dry-filling procedure can be performed such that a CMP process is not required.

When depositing copper into nano-sized features, the copper resistivity can increase significantly due to increased electron scattering on grain boundaries and interfaces and the increased resistivity can decrease the move towards even smaller features. The inventor believes that the dry-filling procedures described herein will provide a means for depositing copper having larger copper grains thereby decreasing the grain boundaries and providing a better electron flow. In addition, the inventor believes that the dry-filling procedures described herein will provide a means for decreasing the size of the barrier layer as nano-sized features get even smaller.

During the dry-filling process, the process is controlled to prevent the agglomeration of copper on the sidewalls as the vias and/or trenches are filled in a bottom-up manner. Agglomeration on the sidewalls of the vias and/or trenches can cause discontinuities in the deposited material.

Figure 2A:
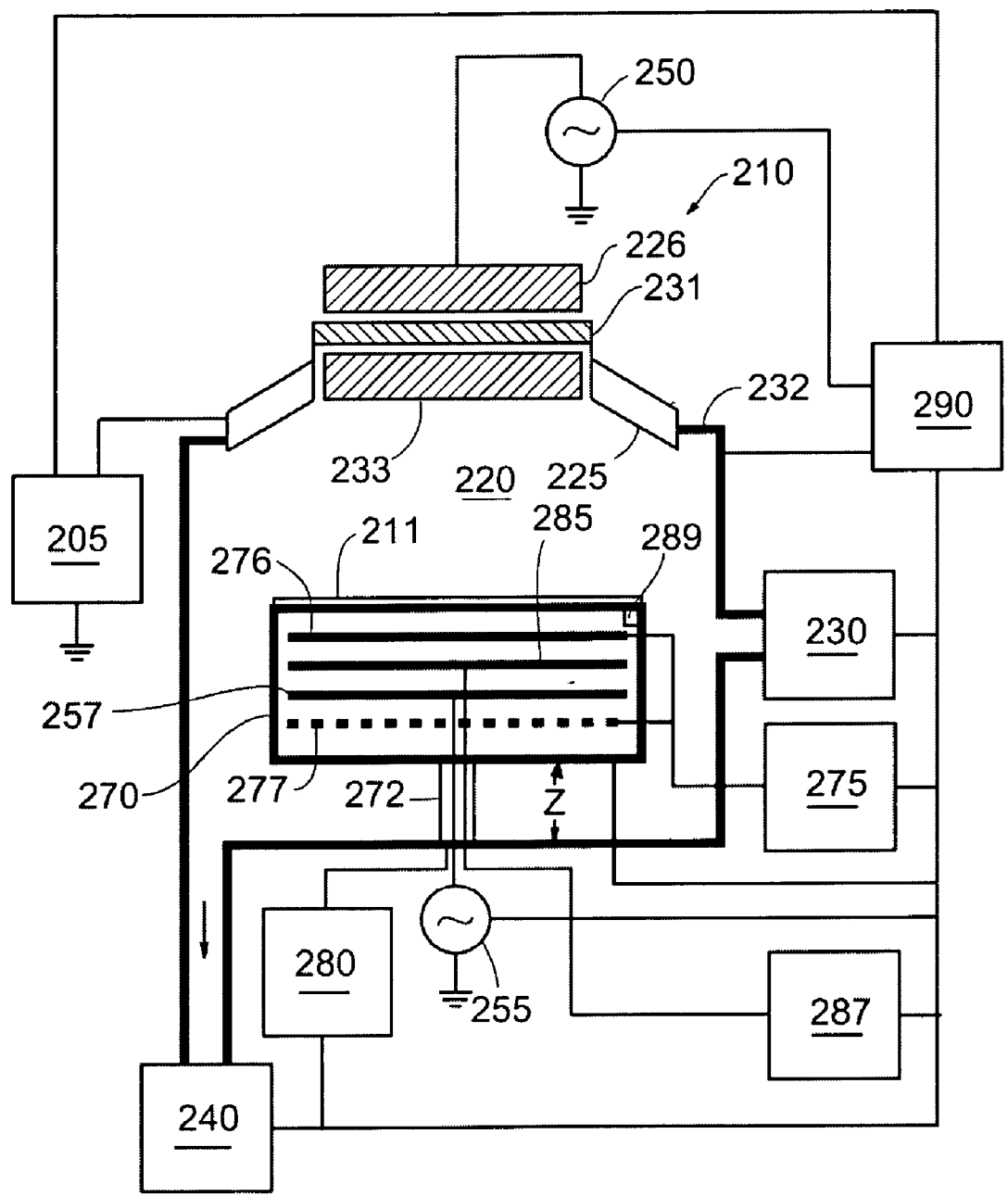
FIG. 2A illustrates an exemplary block diagram of a processing system according to an embodiment of the invention.

FIG. 2A illustrates an exemplary block diagram of a processing system according to an embodiment of the invention. In the illustrated embodiment, an iPVD system 200A is shown.

The iPVD system 200A can comprise an iPVD processing module 210, a DC source 205 coupled to a target 225 that is coupled to the processing chamber 220, a process gas supply system 230 coupled to a processing chamber 220, a pressure control system 240 coupled to the processing chamber 220, a RF source 250 coupled to the processing chamber 220, an RF bias generator 255 coupled to an electrode 257 in the substrate holder 270, a backside gas supply system 280 coupled to the substrate holder 270, and a ESC control unit coupled to the ESC 285.

The iPVD system comprises a controller 290 coupled to the processing chamber 220, coupled to the DC source 205, coupled to the gas supply system 230, coupled to the pressure control system 240, coupled to the RF source 250, coupled to the RF bias generator 255, coupled to the substrate holder 270, coupled to the thermal control system 275, coupled to the backside gas supply system 280, and coupled to the ESC control unit 287.

The iPVD processing module further comprises an antenna 226, a window 231 coupled to the antenna, a louvered deposition baffle 233 coupled to the window, a target 225 coupled to the processing chamber 220. RF power can be supplied to the antenna 226 from the RF generator 250, and can be used to create an inductively coupled plasma in the chamber 220.

The antenna 226 can be electrically connected using a RF matching network (not shown) to, and selectively energized or powered by, the RF generator 250. The RF generator 250 can provide a time-varying RF current at a frequency between about 100 kHz and about 100 MHz that is supplied to the antenna 226 at a power ranging between about 100 watts and about 10000 watts. For example, an operating frequency of approximately 13.56 MHz can be used. Alternately, other frequencies can be used. When energized by the RF generator 250, the antenna 226 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

Examples of iPVD systems are described in U.S. Pat. Nos. 6,287,435; 6,080,287; 6,197,165 and 6,132,564, and these patents are hereby expressly incorporated herein by reference.

In one embodiment, a controllable backside pressure can be established that allows the apparatus controller to set the relative influence of the backside pressure on the respective process steps differently, depending on the process parameters. This may include variable backside pressures or flexible duty cycles.

The antenna 226 can be positioned outside of the process chamber 220 behind a dielectric window 231 in the chamber wall 232. A louvered deposition baffle 233, preferably formed of a slotted metallic material, is located inside of the chamber 220 closely spaced from the window 231 to shield the window 231 from deposition. The controller 290 can be used to determine the amount of ICP power to provide and when to have it applied to the antenna. For example, ICP power from the RF generator 250 to the antenna 226 can be switched between different power levels during the different steps in a deposition and/or dry-filling process.

The iPVD system 200A can also comprise a substrate holder 270 that can include an electrostatic chuck 285 and can be coupled to the processing chamber using a Z-motion drive 272. The Z-motion drive 272 can be used to adjust the substrate-to-source distance to provide the best deposition uniformity. The controller 290 can be used to determine the gap size required during the dry-filling process and provide the control data to the Z-motion drive 272 when it is required. During a deposition and/or dry-filling process, the substrate-to-source distance can typically be 150 to 300 mm.

The substrate holder 270 can accommodate a 200 mm substrate, a 300 mm substrate, or a larger substrate. For example, substrate 211 can be transferred into and out of processing chamber 220 through an opening (not shown) that is controlled by a gate valve assembly (not shown). In addition, substrate 211 can be transferred on and off the substrate holder 270 using a robotic substrate transfer system (not shown). In addition, substrate 211 can be received by substrate lift pins (not shown) housed within substrate holder 270 and mechanically translated by devices housed therein. Once the substrate 211 is received from the transfer system, it can be lowered to an upper surface of the substrate holder 270.

During processing, a substrate 211 can be held in place on top of the substrate holder 270 using an electrostatic chuck 285. Alternately, other clamping means may be used.

In addition, the substrate temperature can be controlled when the substrate is on the substrate holder 270. The substrate holder can include a heater assembly 276 and a cooling assembly 277 that can be coupled to the temperature control system 275. The heater assembly 276 and the cooling assembly 277 can be used along with one or more backside gases to establish the correct substrate temperature. The temperature of the substrate 211 can be controlled to obtain the best via metallization. The controller 290 can be used to determine and control the substrate temperature. For example, the cooling assembly 277 may include fluid passages (not shown) in the substrate holder 270 and the appropriate temperature controls.

The thermal conductivity between the substrate holder 270 and the substrate 211 can be controlled by providing backside gas between the substrate 211 and the substrate holder 270. Process parameters can be controlled during the deposition and/or dry-filling steps to ensure that the metal deposited in the via structures is uniform and not agglomerated. For example, heat generated in the substrate 211 during plasma processing can be extracted efficiently by the substrate holder 270 to keep the temperature of the substrate 211 at a substantially constant temperature, or the heat can be used to increase the substrate temperature.

Gas channels (not shown) can be used to direct a backside (heat transfer) gas, such as helium or argon, between the top of the substrate holder 270 and the facing surface of the substrate 211. For example, a two-zone system may be used to establish different and independent backside pressure values for a center portion and an edge portion thereby providing a different thermal conductivity between the substrate holder and different portions of the substrate.

The backside gas can be used to control the transfer of heat energy between the substrate holder 270 and substrate 211 by providing an efficient heat transfer medium. The electrostatic chuck 285 can also be used to control the transfer of heat between the substrate 211 and substrate holder 270. For example, the electrostatic force can be made approximately uniform to cause a significant portion of the facing surface of the substrate 211 to physically contact the top surface of the substrate holder 270 and to contact the top surface of the substrate holder 270 with a substantially uniform force. The electrostatic force can also be controlled to limit the leakage of heat transfer gas from beneath the substrate 211 when the backside gas pressure changes, thereby maintaining a controlled backside gas pressure and providing the correct thermal conductivity between the substrate 211 and the substrate holder 270.

One or more temperature sensors 289 can be positioned at one or more locations on or within the substrate holder 270 and can be coupled to the controller 290 that converts signals from the temperature sensors 289 to provide an indication of the temperature of different portions of substrate holder 270. The temperature of the substrate holder 270 can be used to determine the temperature of the substrate 211 and the controller 290 can provide feedback information to the temperature control system 275 and the backside gas supply system 280 for regulating the temperature of substrate 211.

For example, the backside gas can be supplied at a pressure in a range from approximately zero Torr to approximately ten Torr, and the backside gas can apply a force to the substrate 211 due to the pressure differential between the backside gas pressure and the pressure within the vacuum processing chamber 220 which can vary during processing between about 5 mTorr and about 500 mTorr. The force applied by the backside gas acts to displace the substrate 211 from the substrate holder 270, and to counteract this force, a clamping voltage can be applied to the electrostatic chuck 285 to establish an attractive electrostatic force of a magnitude sufficient to secure the substrate 211 to the substrate holder 270.

RF bias power can be supplied to an electrode 257 in the substrate holder 270 using the RF bias generator 255, and can be used to provide a substrate bias. The controller 290 can be used to determine the amount of RF bias power to provide and when to have it applied to the substrate holder 270. For example, RF bias power can be turned on to a level appropriate during deposition and/or dry-filling processes to control the bias on the substrate 211 to improve and affect the process.

The operating frequency for the RF bias generator 255 can range from 1 MHz to 100 MHz. The RF bias generator 255 can be used to selectively apply a bias potential that accelerates positively charged plasma components toward the substrate. The bias potential provided by the RF bias generator 255 substantially determines the kinetic energies of positive ions attracted to the substrate from the plasma. The RF bias generator 255 typically operates at a frequency of about 13.56 MHz and at a power between about 100 watts and about 1000 watts. Alternately, the RF bias generator 255 may be omitted from the processing system and the substrate holder may be either grounded or electrically floating. Alternately, other frequencies can be used, such as 2 MHz or 27 MHz.

Process gas can be provided to the processing chamber 220 by the gas supply system 230. The process gas can comprise a metal-containing gas, or an inert gas, or a combination thereof. The inert gas may be argon, which is often used, but may also be any other inert gas or may be a non-inert gas that is compatible with the process.

Chamber pressure can be controlled using the pressure control system 240. In addition, process gas can be supplied into the vacuum processing chamber 220 by the gas supply system 230. The chamber pressure can be maintained at a low pressure by the pressure control system 240. The controller 290 can be used to control the pressure control system 240, and/or the gas supply system 230 and to control the chamber pressure accordingly.

DC power can be supplied from a power source 205 to the target 225. The controller 290 can be used to determine the amount of DC power to provide and when to have it applied to the target. For example, during a DC-on cycle, the DC power to the target 225 can be controlled to produce a substantially uniform deposition and/or dry-filling process, and during a shaping plasma process (controlled DC process), the DC power to the target 225 can be reduced or turned off to shape the size of the feature openings and/or substantially reduce or stop a deposition and/or dry-filling process. In some cases, a shaping plasma process may be performed by reducing the DC power level to a very low level without completely turning it off. Alternatively, the amount of the overhanging material around the feature openings may be reduced during a shaping plasma process by controlling the ICP power level and the RF bias power level. For example, an inert gas plasma can be used as the shaping plasma. Furthermore, by adjusting (lowering) the RF bias power while maintaining a substantially constant ICP power, the ion bombardment can be adjusted to a level below the etch threshold and this can increase the surface mobility of copper on sidewall and corner.

The controller 290 can be configured to provide control data to the system components and receive process and/or status data from the system components. In addition, the controller 290 may be coupled to another control system (not shown), and can exchange information with the other control system. For example, the controller 290 can comprise a microprocessor, a memory (e.g., volatile or non-volatile memory), and a digital I/O port capable of generating control voltages sufficient to communicate and activate inputs to the iPVD system 200A as well as monitor outputs from the iPVD system 200A. Moreover, the controller 290 can exchange information with the system components, and a program stored in the memory can be utilized to control the aforementioned components of an iPVD system 200A according to a process recipe. In addition, the controller 290 can be configured to analyze the process and/or status data, to compare the process and/or status data with desired process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 2B:
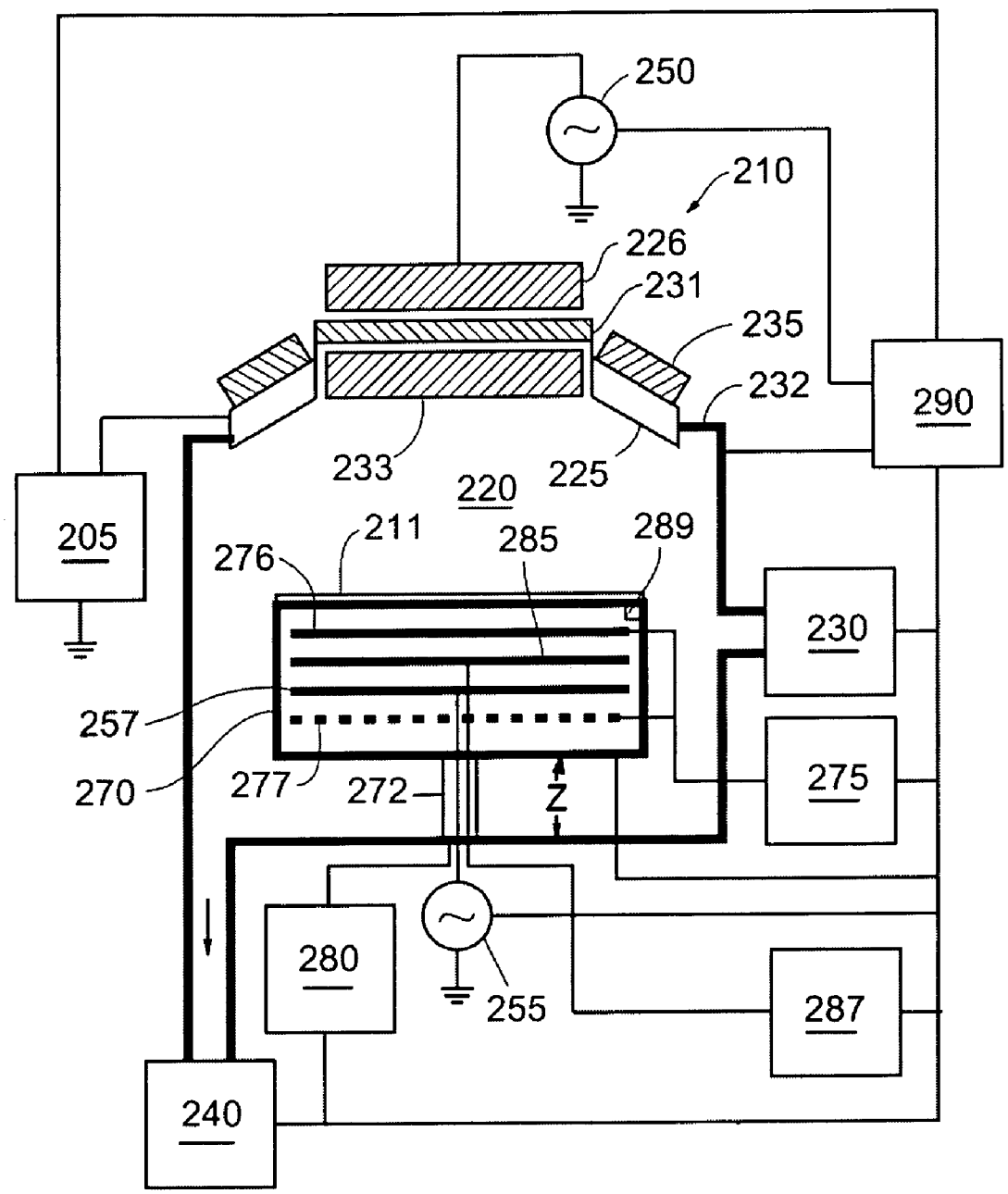
FIG. 2B illustrates an exemplary block diagram of a processing system according to an alternate embodiment of the invention.

FIG. 2B illustrates an exemplary block diagram of a processing system according to an alternate embodiment of the invention. In the illustrated embodiment, an IPVD system 200B is shown that can include the IPVD system shown in FIG. 2A along with a magnet assembly 235 coupled to the processing chamber 200. The magnet assembly 235 may be used to shape the plasma within the processing chamber 200. Examples of apparatus having reduced and controllable magnetic fields are described in U.S. Pat. App. 20040188239, hereby incorporated herein by reference.

In various embodiments, one or more process parameters can be measured and compared with desired process parameters to control the operation of one or more components of the iPVD system. The measured performance can be used to alter one or more process parameters, such as a DC-on time, a shaping plasma process time, a DC-off time, a DC power, a backside pressure, substrate holder temperature, substrate temperature, etching rate, and/or deposition rate.

The controller 290 can be used to determine the amount of heat energy that the heater assembly 276 provides and when to have it provided to the substrate 211. The amount of heat energy can be changed between different levels during a dry-filling and/or deposition process. In addition, the cooling element 277 can be used to control the temperature of the substrate holder 270 and the substrate 211. For example, the thermal mass of the substrate holder 270 can be controlled to optimize its thermal response time. Furthermore, the thermal conductance between the substrate holder 270 and the substrate 211 can be controlled by providing backside gas between the substrate 211 and the substrate holder 270. The controller 290 can monitor and control the substrate temperature, the temperature of the substrate holder 270, the temperature control system 275, the backside gas system 280, and other process parameters during a dry-filling step to ensure that the metal deposition within the features is uniform and not agglomerated. In addition, the performance of the electrostatic chuck 285 may be controlled to compensate for changes in the backside pressure.

Figure 3A:
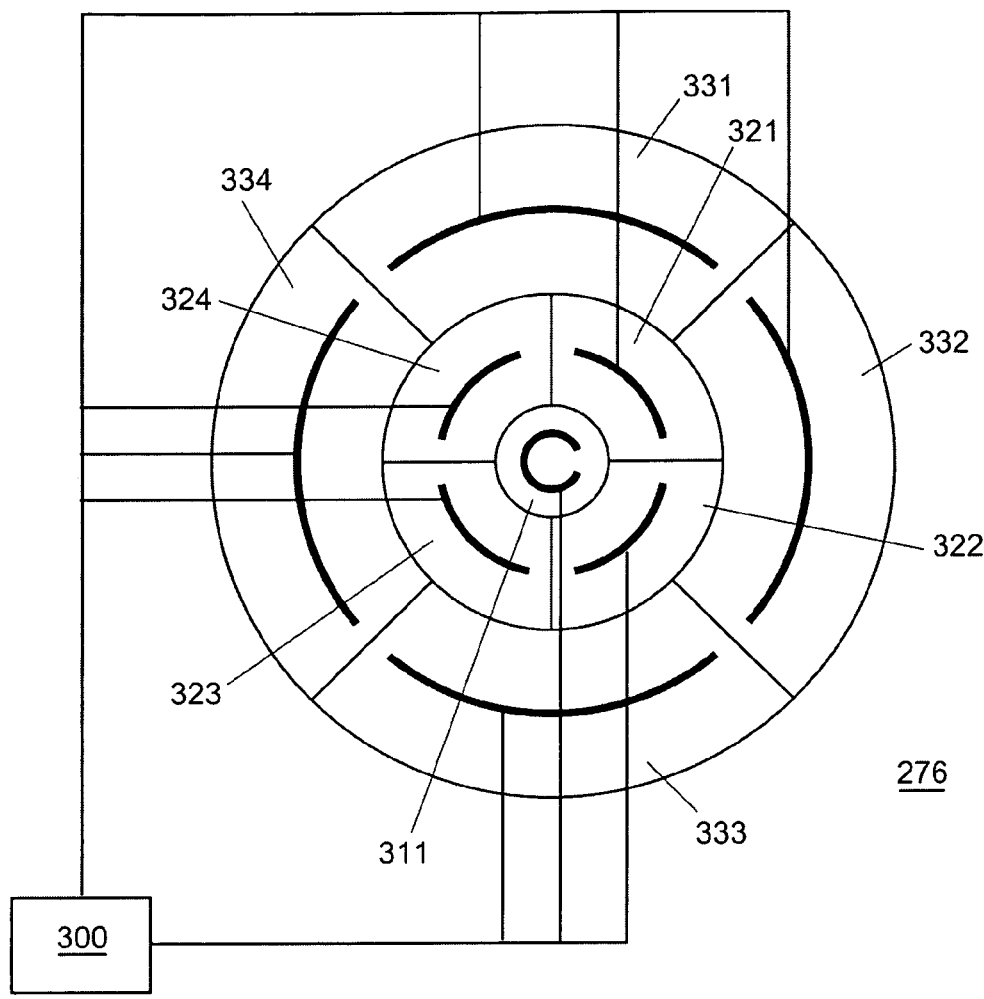
FIG. 3A illustrates a simplified schematic diagram of a substrate heater assembly in accordance with an embodiment of the invention.

FIG. 3A illustrates a simplified block diagram of a heater assembly in accordance with an embodiment of the invention. In the illustrated embodiment, a nine element (311, 321, 322, 323, 324, 331, 332, 333, and 334) heater assembly and control unit 300 is shown, but this is not required for the invention. In an alternate embodiment, a different number of elements and a different configuration may be used.

In one embodiment, the nine element (311, 321, 322, 323, 324, 331, 332, 333, and 334) heater assembly can be mounted in a single cylindrical piece of dielectric material 301 that provides the heater assembly with a low thermal mass. Alternatively, one or more pieces of quartz may be used.

Figure 3B:
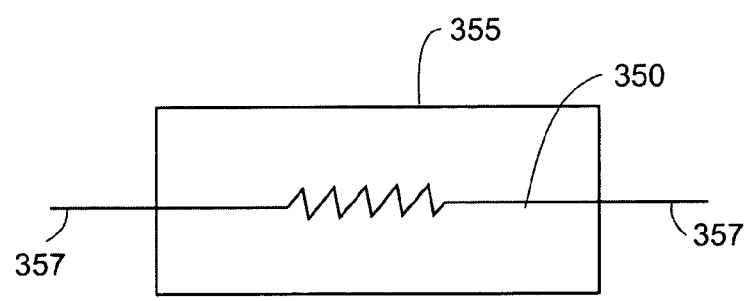
FIG. 3B illustrates a simplified schematic diagram of a heater element in accordance with an embodiment of the invention.

FIG. 3B illustrates a simplified schematic diagram of a heater element in accordance with an embodiment of the invention. Each of the elements can comprise a carbon wire heater 350 that can be enclosed in a quartz tube 355. For example, the carbon wire heater 350 may be formed by knitting a plurality of bundles of carbon fibers together. The carbon wire heater 350 can generate heat when the carbon wire heater 350 is energized through a power supply line 357. The power supply lines 357 can be coupled to the control unit 300. For example, the control unit 300 can control the current through the carbon wire heater 350 in each element. In addition, one or more temperature sensors (not shown) can be coupled to the heater assembly and the control unit 300 for measuring the temperature of the heater assembly 276. For example, temperature sensors can be positioned radially on the heater assembly.

Various techniques for constructing and configuring carbon wire heaters are taught in co-pending patent application Ser. No. 10/813,119 entitled "Substrate Heater Assembly" filed on Mar. 31, 2004 and this application is incorporated by reference herein in its entirety.

Figure 4:
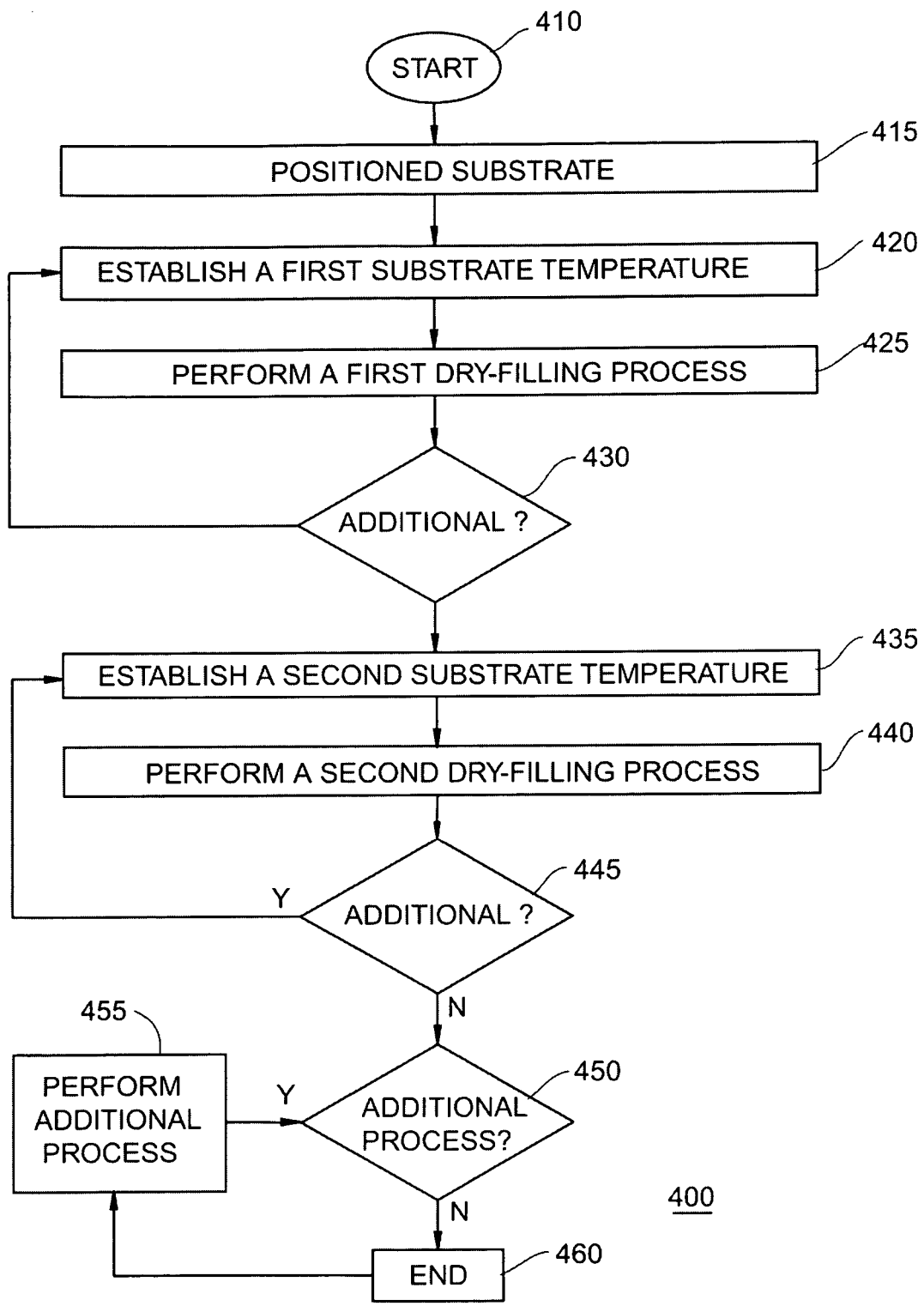
FIG. 4 illustrates a simplified flow diagram of a method of operating a deposition system to perform a process in accordance with an embodiment of the invention.

FIG. 4 illustrates a simplified flow diagram of a method of operating a deposition system to perform a process in accordance with an embodiment of the invention. In the illustrated embodiment, a dry-filling process is shown. In alternate embodiments, other procedures can be performed that may include one or more NND processes, one or more LND processes, and various combinations of LND processes and NND processes. Procedure 400 starts in 410.

In 415, a patterned substrate can be positioned on a substrate holder and clamped using an electrostatic chuck in a processing chamber as described herein. Alternately, an electrostatic chuck may not be required. For example, the processing chamber can be an iPVD chamber.

In one embodiment, the substrate holder can be vertically translated to establish the required gap between the target and the substrate. Alternately, the gap can be established at a different time or the gap can be changed. For example, the gap may be changed when plasma is not present. The gap size can range from approximately 100 mm to 400 mm. Alternatively, the gap can range from approximately 200 mm to 300 mm.

In 420, a first substrate temperature can be established. In various embodiments, the substrate heater assembly 276, the cooling assembly 277, the processing chamber 220 parameters, and/or the ambient conditions can be used to establish the temperature of the substrate holder 270 at a value at or above approximately 50° Celsius at the start of the process sequence. In addition, the substrate heater assembly 276, the cooling assembly 277, the ESC 285, the backside gas system 280, and/or the processing chamber 220 parameters can be used to establish the temperature of the substrate 211 at a value at or above approximately 50° Celsius at the start of the process sequence. Alternatively, the temperature of the substrate 211 may be established at a temperature below approximately 50° Celsius at the start of the process sequence. In other embodiments, a different starting temperature range may be used.

In addition, a first thermal conductivity value can be established by providing a first backside pressure to the substrate 211 and applying a clamping voltage to the electrostatic chuck 285 to establish the required attractive electrostatic force. For example, the clamping voltage can vary from −2000 V to 2000 V for different types of ESCs. The first backside pressure can be established by flowing a backside gas to the backside of the substrate 211 at a first rate. In one embodiment, a multi-zone heating assembly can be used and a single zone backside gas system can be used. Alternatively, a multi-zone backside gas system may be used. The substrate holder 270 temperature and/or the thermal conductivity between the substrate holder 270 and the substrate 211 can be controlled at the start of the process sequence to establish a substantially uniform temperature across the substrate at the start of the process to ensure a uniform process.

In 425, a first dry-filling process can be performed. In various embodiments, the substrate heater assembly 276, the cooling assembly 277, the processing chamber 220 parameters, and/or the ambient conditions can be used to maintain the temperature of the substrate holder 270 at a value that can range from approximately 50° Celsius to approximately 250° Celsius during the first dry-filling process. In addition, the substrate heater assembly 276, the cooling assembly 277, the ESC 285, the backside gas system 280, and/or the processing chamber 220 parameters can be used to maintain the temperature of the substrate 211 at a value that can range from approximately 50° Celsius to approximately 250° Celsius during the first dry-filling process.

In one embodiment, the first thermal conductivity value, established at the start of the process sequence, can be controlled during the first dry-filling process by controlling the backside pressure to the substrate 211 and controlling the clamping voltage applied to the electrostatic chuck 285 to establish the required attractive electrostatic force. Alternatively, the first thermal conductivity value may be changed during the first dry-filling process. The substrate holder 270 temperature and/or the thermal conductivity between the substrate holder 270 and the substrate 211 can be controlled during the first dry-filling process to establish a substantially uniform temperature across the substrate during the first dry-filling process to ensure a uniform process. For example, the substrate holder temperature and/or the thermal conductivity can be controlled so that the heat generated in the substrate 211 during plasma processing can be efficiently extracted by the substrate holder 270.

In other embodiments, the substrate heater assembly 276, the cooling assembly 277, the processing chamber 220 parameters, and/or the ambient conditions can be used to increase the substrate holder 270 temperature from a value that can be above approximately 50° Celsius to a value the can be below approximately 250° Celsius during the first dry-filling process. In addition, the substrate heater assembly 276, the cooling assembly 277, the ESC 285, the backside gas system 280, and/or the processing chamber 220 parameters can be used to increase the substrate 211 temperature from a value that can be above approximately 50° Celsius to a value the can be below approximately 250° Celsius during the first dry-filling process. For example, the substrate holder 270 temperature and/or the first thermal conductivity value, established at the start of the process sequence, may be changed during the first dry-filling process. For example, a heater power, a substrate holder temperature, and/or a backside pressure value can be stepped, pulsed, cycled, and/or linearly changed during the first dry-filling process. In addition, the backside pressure during the first dry-filling process can range between approximately zero Torr and approximately ten Torr. Alternatively, the backside pressure range may be between approximately one Torr and approximately five Torr.

During a first dry-filling process time, a first portion of metal is deposited into at least one feature of the patterned substrate. A first high-density plasma can be created during a first dry-filling process time. The first high-density plasma can be created using a first process gas that can be flowed into the processing chamber using a gas supply system coupled to the processing chamber. In one embodiment, the first process gas can comprise an inert gas. The inert gas can comprise argon, helium, krypton, radon, xenon, or a combination thereof. Alternatively, the first process gas can comprise an inert gas, a nitrogen-containing gas, an oxygen-containing gas, a metal-containing gas, or a combination thereof. The nitrogen-containing gas can comprise $N_2$, NO, $N_2O$, and $NH_3$, and the oxygen-containing gas can comprise $O_2$, NO, $N_2O$, and $H_2O$. The metal-containing gas comprises copper (Cu), tantalum (Ta), titanium, (Ti), ruthenium (Ru), iridium (Ir), aluminum (Al), silver (Ag), platinum (Pt), or a combination thereof.

During a dry-filling process, the flow rate for the process gas can vary from 0 sccm to approximately 1000 sccm; the flow rate for the inert gas can vary from 0 sccm to approximately 1000 sccm; the flow rate for the nitrogen-containing gas can vary from 0 sccm to approximately 1000 sccm; the flow rate for the oxygen-containing gas can vary from 0 sccm to approximately 1000 sccm; and the flow rate for the metal-containing gas can vary from 0 sccm to approximately 1000 sccm.

A first ICP power level can be provided by an ICP source operating at a first ICP frequency when creating the first high-density plasma. The ICP source can be coupled to an antenna coupled to the processing chamber. The ICP source can be an RF generator, and the ICP source can operate in a frequency range from approximately 1.0 MHz to approximately 100 MHz. Alternatively, the frequency may range from approximately 10 MHz to approximately 30 MHz. For example, the ICP frequency can be approximately 13.5 MHz, or approximately 27 MHz.

The ICP power can range from approximately 1000 watts to approximately 6000 watts. Alternatively, the ICP power may range from approximately 4500 watts to approximately 5500 watts. For example, the ICP power can be approximately 5250 watts.

In addition, a first RF bias power level can be provided by a RF bias source operating at a first RF bias frequency when creating the first high-density plasma. The RF bias source can be coupled to the substrate holder in the processing chamber.

The RF bias source can be an RF generator, and the RF bias source can operate in a frequency range from approximately 1.0 MHz to approximately 100 MHz. Alternatively, the frequency may range from approximately 10 MHz to approximately 30 MHz. For example, the RF bias frequency can be approximately 13.5 MHz, or approximately 27 MHz.

The RF bias power can range from approximately 100 watts to approximately 1000 watts. Alternatively, the RF bias power may range from approximately 200 watts to approximately 400 watts.

Furthermore, a first DC (target) power level can be provided by a DC source coupled to the metallic target while creating the first high-density plasma. Alternatively, a target power is not required to create the first high-density plasma. The DC power provided by the DC source can range from approximately 0 watts to approximately 6000 watts. Alternatively, the DC power may range from approximately 0 watts to approximately 2000 watts. In one embodiment, the target can include copper (Cu). Alternatively, the target may comprise copper (Cu), tantalum (Ta), titanium, (Ti), ruthenium (Ru), iridium (Ir), aluminum (Al), silver (Ag), platinum (Pt), or a combination thereof.

In various embodiments, the target power can be changed during the first dry-filling process. The first dry-filling process can include one or more DC-on cycles and one or more shaping plasma processes. For example, one high-density plasma can be created during a DC-on cycle by providing substantially simultaneously a RF bias power to the substrate holder and a target power to the target, and another high-density plasma can be created during a shaping plasma process by controlling the amount of DC/target power provided to the target.

When the first dry-filling process is performed using the first high-density plasma, a first thickness of metal is deposited onto the field area of the patterned substrate and a second thickness of metal is deposited into the bottom portion of at least one feature of the patterned substrate. In the present invention, the controller can establish the process parameters required to minimize the field deposition while maximizing the bottom fill and preventing the formation of voids. For example, the controller can simultaneously control the target power, the RF bias power, the ICP power, the backside pressure, the chamber pressure, the substrate temperature, the process chemistry, or the process time, or a combination thereof to provide a dry-filling process that causes a substantially uniform deposition into the features of the substrate.

In addition, the substrate can be exposed to the dry filling plasma during a first time, and the first high-density plasma can be extinguished for a first shutdown period after one or more dry-filling processes have been performed. The first time period can range from approximately 10 seconds to approximately 2000 seconds, and the first shutdown period can range from approximately 0 seconds to approximately 100 seconds. Alternatively, the first shutdown period can range from approximately 4 seconds to approximately 20 seconds. During the first shutdown period, the substrate temperature can change. For example, a new starting value for the substrate holder temperature and/or the substrate temperature can be established when the plasma is extinguished.

In various embodiments, the first dry-filling process can include a number of fill cycles and a number of off-cycles, and a dry-filling process may be repeated a number of times (1-30) to obtain the required fill amount. Alternatively, the first dry-filling process may include one of more shaping plasma cycles. For example, a dry-filling process may include duration times lasting from 1-1500 seconds for fill cycles, shaping cycles, and/or off-cycles. For example, a NND process can be performed during the first dry-filling process time; the first NND process can have a first fill rate; and the first fill rate can range from approximately 0 nm/min to approximately +15 nm/min. The allowable ranges for the substrate holder temperature and/or the substrate temperature can be used to determine the number of cycles and the length of the cycles during the first dry-filling process. For example, the allowable temperatures and ranges can be specified by a process recipe.

In 430, a query can be performed to determine when to perform an additional first dry-filling process. When an additional first dry-filling process is required, procedure 400 can branch back to 420 and proceed as shown in FIG. 4. When an additional first dry-filling process is not required, procedure 400 can branch to 435 and proceed as shown in FIG. 4. In one embodiment, one or more process parameters can be changed when the additional first dry-filling process is performed. For example, the backside pressure may be between approximately zero Torr and approximately five Torr. In one embodiment, a process time can be used to determine when to perform an additional first dry-filling process. Alternatively, optical techniques may be used to determine thicknesses.

In 435, a second substrate temperature can be established. In various embodiments, the substrate heater assembly 276, the cooling assembly 277, the processing chamber 220 parameters, and/or the ambient conditions can be used to maintain the temperature of the substrate holder 270 at a value that can range from approximately 100° Celsius to approximately 350° Celsius before the second dry-filling process is performed. In addition, the substrate heater assembly 276, the cooling assembly 277, the ESC 285, the backside gas system 280, and/or the processing chamber 220 parameters can be used to maintain the temperature of the substrate 211 at a value that can range from approximately 100° Celsius to approximately 350° Celsius before the second dry-filling process is performed.

In 440, a second dry-filling process can be performed. In various embodiments, the substrate heater assembly 276, the cooling assembly 277, the processing chamber 220 parameters, and/or the ambient conditions can be used to maintain the temperature of the substrate holder 270 at a value that can range from approximately 100° Celsius to approximately 350° Celsius during the second dry-filling process. In addition, the substrate heater assembly 276, the cooling assembly 277, the ESC 285, the backside gas system 280, and/or the processing chamber 220 parameters can be used to maintain the temperature of the substrate 211 at a value that can range from approximately 100° Celsius to approximately 350° Celsius during the second dry-filling process.

In one embodiment, a second thermal conductivity value can be established and controlled during the second dry-filling process by controlling the backside pressure to the substrate 211 and controlling the clamping voltage applied to the electrostatic chuck 285 to establish the required attractive electrostatic force. Alternatively, the first thermal conductivity value may be maintained during the second dry-filling process. The substrate holder 270 temperature and/or the thermal conductivity between the substrate holder 270 and the substrate 211 can be controlled during the second dry-filling process to establish a substantially uniform temperature across the substrate during the second dry-filling process to ensure a uniform process. For example, the substrate holder temperature and/or the thermal conductivity can be controlled so that the heat generated in the substrate 211 during plasma processing can be efficiently extracted by the substrate holder 270.

In other embodiments, the substrate heater assembly 276, the cooling assembly 277, the processing chamber 220 parameters, and/or the ambient conditions can be used to increase the substrate holder 270 temperature from a value that can be above approximately 100° Celsius to a value the can be below approximately 350° Celsius during the second dry-filling process. In addition, the substrate heater assembly 276, the cooling assembly 277, the ESC 285, the backside gas system 280, and/or the processing chamber 220 parameters can be used to increase the substrate 211 temperature from a value that can be above approximately 100° Celsius to a value the can be below approximately 350° Celsius during the second dry-filling process. The substrate holder 270 temperature and/or the thermal conductivity value established during the first dry-filling process can be changed during the second dry-filling process.

In one embodiment, the substrate heater assembly 276 can be used to establish the temperature of the substrate holder and/or substrate at a value above approximately 100° C. In addition, the second thermal conductivity value can be established by providing a second backside pressure to the substrate 211 and applying a second clamping voltage to the electrostatic chuck 285 to establish the required attractive electrostatic force. The second backside pressure can be established by flowing a backside gas to the backside of the substrate 211 at a second rate. In one embodiment, a multi-zone heating assembly can be used and a single zone backside gas system can be used. Alternatively, a multi-zone backside gas system may be used. The thermal conductivity between the substrate holder 270 and the substrate 211 can be controlled during the deposition and/or dry-filling steps to ensure a uniform fill. For example, the second backside pressure may be lower than the first backside pressure causing the thermal conductivity to decrease.

During the second dry-filling process time, a second portion of metal is deposited into at least one feature of the patterned substrate. In addition, during the second dry-filling process time, a second high-density plasma can be created.

A second high-density plasma can be created during a second dry-filling process time. The second high-density plasma can be created using a second process gas that can be flowed into the processing chamber using a gas supply system coupled to the processing chamber. In one embodiment, the second process gas can comprise an inert gas. The inert gas can comprise argon, helium, krypton, radon, xenon, or a combination thereof. Alternatively, the second process gas can comprise an inert gas, a nitrogen-containing gas, an oxygen-containing gas, a metal-containing gas, or a combination thereof. The nitrogen-containing gas can comprise $N_2$, NO, $N_2O$, and $NH_3$, and the oxygen-containing gas can comprise $O_2$, NO, $N_2O$, and $H_2O$. The metal-containing gas comprises copper (Cu), tantalum (Ta), titanium, (Ti), ruthenium (Ru), iridium (Ir), aluminum (Al), silver (Ag), platinum (Pt), or a combination thereof.

A second ICP power level can be provided by an ICP source operating at a second ICP frequency when creating the second high-density plasma. The ICP source can be coupled to an antenna coupled to the processing chamber. The ICP source can be an RF generator, and the ICP source can operate in a frequency range from approximately 1.0 MHz to approximately 100 MHz. Alternatively, the frequency may range from approximately 10 MHz to approximately 30 MHz. For example, the ICP frequency can be approximately 13.5 MHz, or approximately 27 MHz.

The second ICP power can range from approximately 1000 watts to approximately 6000 watts. Alternatively, the second ICP power may range from approximately 4500 watts to approximately 5500 watts. For example, the ICP power can be approximately 5250 watts.

In addition, a second RF bias power level can be provided by a RF bias source operating at a second RF bias frequency when creating the second high-density plasma. The RF bias source can be coupled to the substrate holder in the processing chamber.

The RF bias source can be an RF generator, and the RF bias source can operate in a frequency range from approximately 1.0 MHz to approximately 100 MHz. Alternatively, the frequency may range from approximately 10 MHz to approximately 30 MHz. For example, the RF bias frequency can be approximately 13.5 MHz, or approximately 27 MHz.

The second RF bias power can range from approximately 100 watts to approximately 1000 watts. Alternatively, the RF bias power may range from approximately 200 watts to approximately 400 watts.

Furthermore, a second DC power level can be provided by a DC source coupled to the metallic target while creating the second high-density plasma. The second DC power provided by the DC source can range from approximately 0 watts to approximately 6000 watts. Alternatively, the second DC power may range from approximately 0 watts to approximately 2000 watts. In one embodiment, the target can include copper (Cu). Alternatively, the target may comprise copper (Cu), tantalum (Ta), titanium, (Ti), ruthenium (Ru), iridium (Ir), aluminum (Al), silver (Ag), platinum (Pt), or a combination thereof.

For example, a heater power, a substrate holder temperature, and/or a backside pressure value can be stepped, pulsed, cycled, and/or linearly changed during the second dry-filling process. In addition, the backside pressure during the second dry-filling process can range between approximately zero Torr and approximately ten Torr. Alternatively, the backside pressure range may be between approximately one Torr and approximately five Torr.

When the second dry-filling process is performed using the second high-density plasma, an additional thickness of metal is deposited onto the field area of the patterned substrate and an additional thickness of metal is deposited into the features of the patterned substrate. In the present invention, the controller can establish the process parameters required to maximize the filling of the features, while preventing the formation of voids, minimizing the field deposition, and optimizing the size of the opening at the top of the features.

In one embodiment, the target power can be changed during the second dry-filling process. The second dry-filling process can include one or more DC-on cycles and one or more shaping plasma cycles.

In addition, the substrate can be exposed to the second dry filling plasma during a second time period, and the second dry filling plasma can be extinguished during a second shutdown period after one or more dry-filling processes have been performed. The second time period can range from approximately 10 seconds to approximately 2000 seconds, and the second shutdown period can range from approximately 0 second to approximately 100 seconds. Alternatively, the second shutdown period can range from approximately 4 seconds to approximately 20 seconds. During the second shutdown period, the substrate holder temperature and/or substrate temperature can change. For example, the substrate temperature can decrease when the plasma is extinguished. In other embodiments, a shutdown period may not be required during every cycle.

In addition, a shaping plasma may be created during a portion of the second dry-filling process by changing one or more process parameters. In some cases, the dry-filling plasma may be extinguished after a dry filling process; a shaping plasma may be created; and the shaping plasma may be extinguished after a shaping plasma process. In other embodiments, a shaping plasma may not be required.

In various embodiments, the second dry-filling process may include a number of DC-on cycles, a number of shaping plasma cycles, and a number of plasma off-cycles, and the second dry-filling process may be repeated a number of times (1-30) to obtain the required fill amount. For example, a dry-filling process may include process times lasting from 1-1500 seconds for the dry-filling cycles, the shaping plasma cycles, and/or the off-cycles. For example, a NND process can be performed, and the second fill rate can range from approximately +2 nm/min to approximately +25 nm/min. The allowable ranges for the substrate holder temperature and/or the substrate temperature can be used to determine the number of cycles and the length of the cycles during the second dry-filling process.

In 445, a query can be performed to determine when to perform an additional second dry-filling process. When an additional second dry-filling process is not required, procedure 400 can branch to 450 and proceed as shown in FIG. 4. When an additional second dry-filling process is required, procedure 400 can branch back to 435. In one embodiment, one or more process parameters can be changed when the additional second dry-filling process is performed. For example, the backside pressure may be between approximately zero Torr and approximately five Torr. In one embodiment, a process time can be used to determine when to perform an additional second dry-filling process. Alternatively, optical techniques may be used to determine thicknesses In 450, a query can be performed to determine when to perform an additional process. When an additional process is required, procedure 400 can branch to 455 and proceed as shown in FIG. 4. When an additional process is not required, procedure 400 can end in 460.

In 455, a third dry-filling process can be performed. In various embodiments, the substrate heater assembly 276, the cooling assembly 277, the processing chamber 220 parameters, and/or the ambient conditions can be used to maintain the temperature of the substrate holder 270 at a value that can range from approximately 150° Celsius to approximately 350° Celsius during the third dry-filling process. In addition, the substrate heater assembly 276, the cooling assembly 277, the ESC 285, the backside gas system 280, and/or the processing chamber 220 parameters can be controlled to maintain the temperature of the substrate 211 at a value that can range from approximately 150° Celsius to approximately 350° Celsius during the third dry-filling process.

In one embodiment, a third thermal conductivity value can be established and controlled during the third dry-filling process by controlling the backside pressure to the substrate 211 and controlling the clamping voltage applied to the electrostatic chuck 285 to establish the required attractive electrostatic force. Alternatively, the second thermal conductivity value may be maintained during the third dry-filling process. The substrate holder 270 temperature and/or the thermal conductivity between the substrate holder 270 and the substrate 211 can be controlled during the third dry-filling process to establish a substantially uniform temperature across the substrate during the third dry-filling process to ensure a uniform process. For example, the substrate holder temperature and/or the thermal conductivity can be controlled so that the heat generated in the substrate 211 during plasma processing can be efficiently extracted by the substrate holder 270 during the third dry-filling process.

In other embodiments, the substrate heater assembly 276, the cooling assembly 277, the processing chamber 220 parameters, and/or the ambient conditions can be used to increase the substrate holder 270 temperature from a value that can be above approximately 150° Celsius to a value the can be below approximately 350° Celsius during the third dry-filling process. In addition, the substrate heater assembly 276, the cooling assembly 277, the ESC 285, the backside gas system 280, and/or the processing chamber 220 parameters can be used to increase the substrate 211 temperature from a value that can be above approximately 150° Celsius to a value the can be below approximately 350° Celsius during the third dry-filling process. The substrate holder 270 temperature and/or the thermal conductivity value established during the first dry-filling process can be changed during the second dry-filling process.

In one embodiment, the substrate heater assembly 276 can be used to establish the temperature of the substrate holder and/or substrate at a value above approximately 150° Celsius. In addition, the third thermal conductivity value can be established by providing a third backside pressure to the substrate 211 and applying a third clamping voltage to the electrostatic chuck 285 to establish the required attractive electrostatic force. The third backside pressure can be established by flowing a backside gas to the backside of the substrate 211 at a third rate. In one embodiment, a multi-zone heating assembly can be used and a single zone backside gas system can be used. Alternatively, a multi-zone backside gas system may be used. The thermal conductivity between the substrate holder 270 and the substrate 211 can be controlled during the third dry-filling process to ensure a uniform fill. For example, the third backside pressure may be lower than the second backside pressure causing the thermal conductivity to decrease.

In one embodiment, a third dry-filling process can be performed using a different substrate temperature. For example, lower power plasma conditions and a higher substrate temperature can be used. During a third dry-filling process time, a third portion of metal can be deposited into the features of the patterned substrate.

A third high-density plasma can be created during a third dry-filling process time. The third high-density plasma can be created using a third process gas that can be flowed into the processing chamber using a gas supply system coupled to the processing chamber. In one embodiment, the third process gas can comprise an inert gas. The inert gas can comprise argon, helium, krypton, radon, xenon, or a combination thereof. Alternatively, the third process gas can comprise an inert gas, a nitrogen-containing gas, an oxygen-containing gas, a metal-containing gas, or a combination thereof. The nitrogen-containing gas can comprise $N_2$, NO, $N_2O$, and $NH_3$, and the oxygen-containing gas can comprise $O_2$, NO, $N_2O$, and $H_2O$. The metal-containing gas comprises copper (Cu), tantalum (Ta), titanium, (Ti), ruthenium (Ru), iridium (Ir), aluminum (Al), silver (Ag), platinum (Pt), or a combination thereof.

A third ICP power level can be provided by the ICP source operating at a third ICP frequency when creating the third high-density plasma. The ICP source can be an RF generator, and the ICP source can operate in a frequency range from approximately 1.0 MHz to approximately 100 MHz. Alternatively, the frequency may range from approximately 10 MHz to approximately 30 MHz. For example, the ICP frequency can be approximately 13.5 MHz, or approximately 27 MHz.

The third ICP power can range from approximately 1000 watts to approximately 6000 watts. Alternatively, the third ICP power may range from approximately 4500 watts to approximately 5500 watts. For example, the ICP power can be approximately 5250 watts.

In addition, a third RF bias power level can be provided by a RF bias source operating at a third RF bias frequency when creating the third high-density plasma. The RF bias source can be coupled to the substrate holder in the processing chamber.

The RF bias source can be an RF generator, and the RF bias source can operate in a frequency range from approximately 1.0 MHz to approximately 100 MHz. Alternatively, the frequency may range from approximately 10 MHz to approximately 30 MHz. For example, the RF bias frequency can be approximately 13.5 MHz, or approximately 27 MHz.

The third RF bias power can range from approximately 100 watts to approximately 1000 watts. Alternatively, the third RF bias power may range from approximately 200 watts to approximately 400 watts.

Furthermore, a third DC power level can be provided by a DC source coupled to the metallic target while creating the third high-density plasma. The third DC power provided by the DC source can range from approximately 0 watts to approximately 6000 watts. Alternatively, the third DC power may range from approximately 0 watts to approximately 2000 watts. In one embodiment, the target can include copper (Cu). Alternatively, the target may comprise copper (Cu), tantalum (Ta), titanium, (Ti), ruthenium (Ru), iridium (Ir), aluminum (Al), silver (Ag), platinum (Pt), or a combination thereof.

When the third dry-filling process is performed using the third high-density plasma, an additional thickness of metal is deposited onto the field area of the patterned substrate and an additional thickness of metal is deposited into the features of the patterned substrate. In the present invention, the controller can establish the process parameters required to minimize the field deposition while maximizing the feature fill and increasing the surface mobility of the deposited metal in the features. For example, the controller can simultaneously control the target (DC) power, the RF bias power, the ICP power, the backside pressure, the chamber pressure, the substrate holder temperature, the substrate temperature, the process chemistry, or the process time, or a combination thereof to provide a second dry-filling process that causes a substantially small amount of net deposition to occur in the field area of the substrate.

In one embodiment, the target power and the RF bias power can be changed during the third dry-filling process. The third dry-filling process can include one or more DC-on cycles and one or more shaping plasma processes. In addition, the RF bias power can be higher during a DC-on cycle than during a shaping plasma process.

In addition, the substrate may be exposed to the third dry filling plasma during a third time period, and the third dry filling plasma can be extinguished during a third shutdown period after one or more dry-filling processes have been performed. The second time period can range from approximately 10 seconds to approximately 2000 seconds, and the second shutdown period can range from approximately 0 second to approximately 100 seconds. Alternatively, the second shutdown period can range from approximately 4 seconds to approximately 20 seconds. During the second shutdown period, the substrate holder temperature and/or substrate temperature can change. For example, the substrate temperature can decrease when the plasma is extinguished. In other embodiments, a shutdown period may not be required during every cycle.

In addition, a shaping plasma may be created during a portion of the third dry-filling process by changing one or more process parameters. In some cases, the dry-filling plasma may be extinguished after a dry filling process; a shaping plasma may be created; and the shaping plasma may be extinguished after a shaping plasma process. In other embodiments, a shaping plasma may not be required during the third dry filling process.

In various embodiments, the third dry-filling process may include a number of DC-on cycles, a number of shaping plasma cycles, and a number of plasma off-cycles, and the third dry-filling process may be repeated a number of times (1-30) to obtain the required fill amount. For example, a dry-filling process may include process times lasting from 1-1500 seconds for the dry-filling cycles, the shaping plasma cycles, and/or the off-cycles. For example, a NND process can be performed, and the third fill rate can range from approximately +2 nm/min to approximately +25 nm/min. The allowable ranges for the substrate holder temperature and/or the substrate temperature can be used to determine the number of cycles and the length of the cycles during the third dry-filling process.

Figure 5:
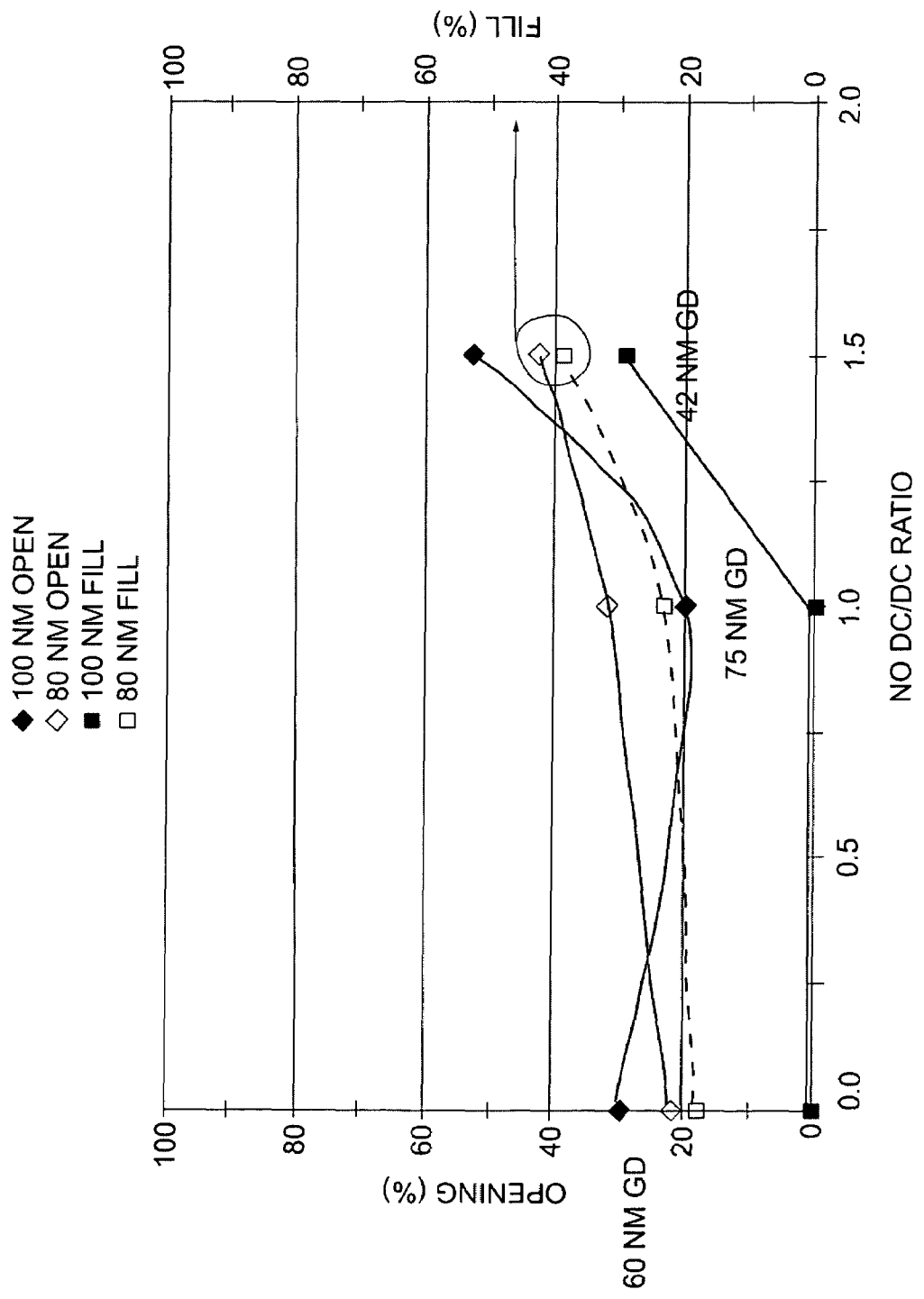
FIGS. 5 and 6 illustrate graphs of exemplary results in accordance with embodiments of the invention.
Figure 6:
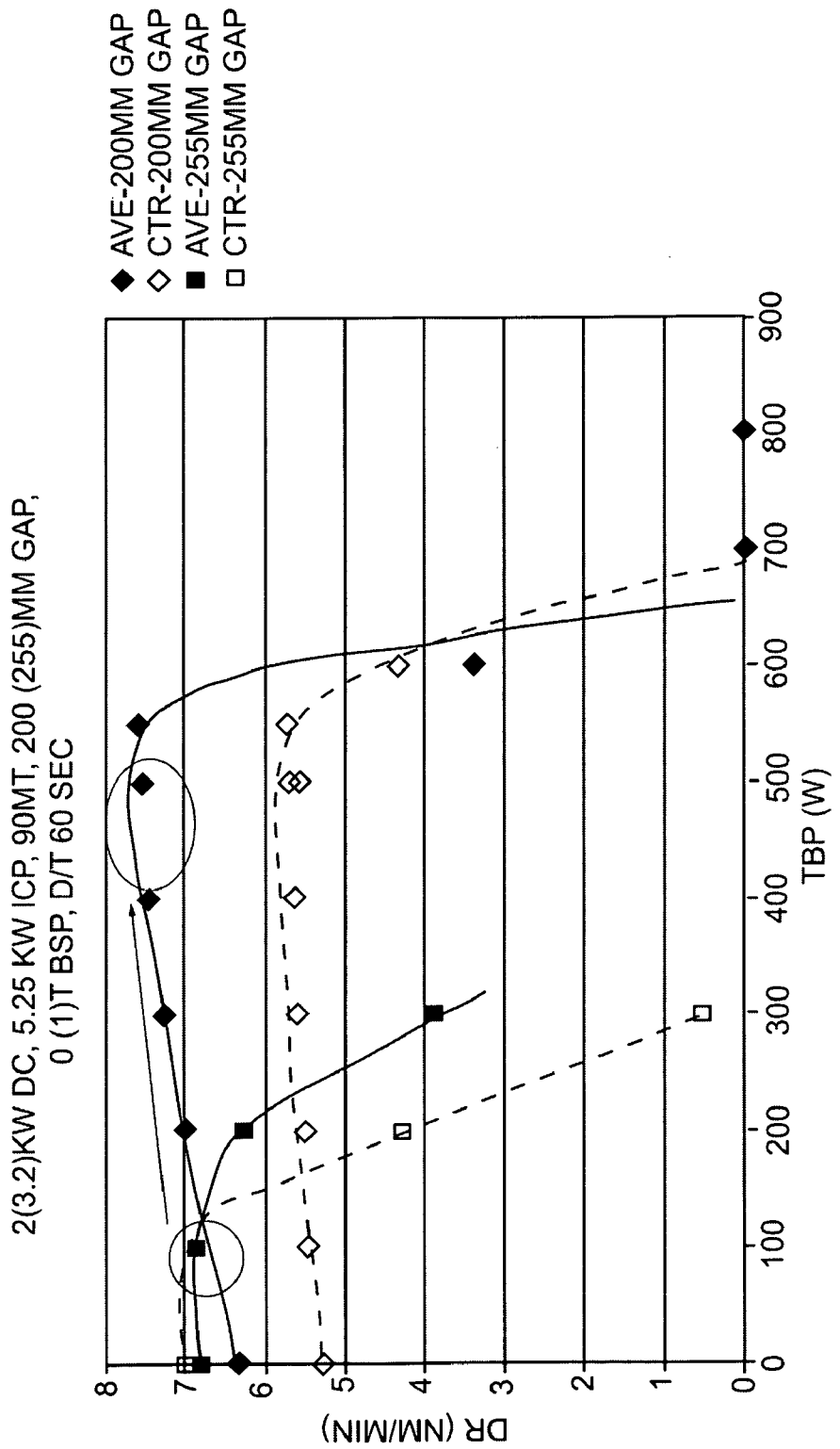
Figure 7:
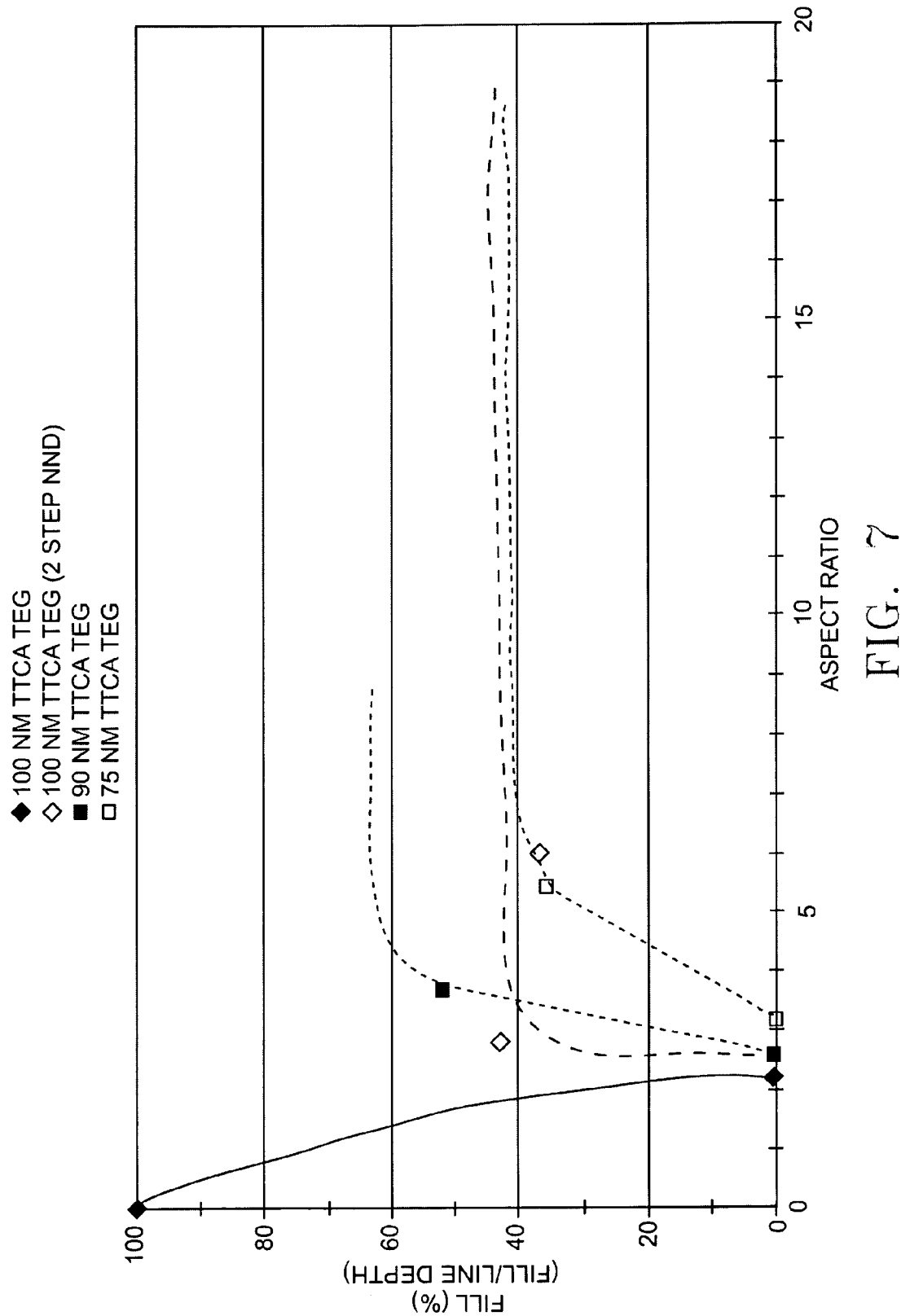
FIG. 7 illustrates a graph of additional exemplary results in accordance with embodiments of the invention.

FIGS. 5A and 5B illustrate graphs of exemplary results in accordance with embodiments of the invention; and FIG. 6 illustrates a graph of additional exemplary results in accordance with embodiments of the invention.

Alternatively, the additional process can comprise an LND process, an NND process, an annealing process, a conventional deposition process, an etching process, a deposition/etch process, a cleaning process, a measurement process, a storing process, an electroplating process, or a combination thereof. The additional processes can be performed in the same processing chamber or other processing chambers. For example, one or more processing chambers can be coupled to each other by a transfer system.

In 460, procedure 400 can end. A processing time may be used to determine when to stop a process. Alternately, thickness data can be used to determine when to stop a process.

In some cases, the additional process can be a measurement process. In one embodiment, the substrate can be removed from the processing chamber and measured in another chamber. For example, an optical digital profile (ODP) tool can be used. In addition, a Scanning Electron Microscope (SEM) tool and/or a Transmission Electron Microscope (TEM) tool can be used.

Measurement data can be obtained during a process and used to determine when to stop the process. Measurement data can include back side pressure data, chamber pressure data, chamber temperature data, substrate temperature data, process gas chemistry data, process gas flow rate data, target material data, ICP power data, substrate position data, target power data, RF bias power data, processing time data, process recipe data, or a combination thereof.

In one embodiment, a method of filling nano-sized features of a patterned substrate with metal using an Ionized Physical Vapor Deposition (IPVD) system is provided. The method can include positioning the patterned substrate on substrate holder in a processing chamber, and establishing a first substrate temperature. The first substrate temperature can be established by establishing a first substrate holder temperature and establishing a first thermal conductivity value between the substrate holder and the substrate. In addition, a first heater power can be provided to a heater assembly that has a fast thermal response and is located in a low thermal mass substrate holder. The patterned substrate can be exposed to a first dry-filling plasma during a first time, then the first dry-filling plasma can be extinguished during a second time.

Next, a second substrate temperature can be established by establishing a second substrate holder temperature and establishing a second thermal conductivity value between the substrate holder and the substrate. In addition, a second heater power can be provided to a heater assembly that has a fast thermal response and is located in a low thermal mass substrate holder. The patterned substrate can be exposed to a second dry-filling plasma during a third time, then the second dry-filling plasma can be extinguished during a fourth time. The patterned substrate can be exposed to a shaping plasma during a fifth time, then the shaping plasma can be extinguished during a sixth time.

In alternate embodiments, a dry-filling process may include a number of DC-on cycles, a number of shaping plasma processes, and a number of off-cycles, and a dry-filling process can also be repeated a number of times (1-20) to fill the nano-sized features. For example, alternate dry-filling processes may include DC-on cycle times that can be equal to approximately 10-1500 seconds, shaping plasma process times that can be equal to approximately 10-500 seconds, and off-cycle times that can be equal to approximately 5-100 seconds.

Barrier processes can be performed before the dry-filling processes and can be performed in the same processing chamber or another processing chamber coupled to a common transfer system. For example, barrier recipes may be as shown in Table 1.

TABLE 1

|  | Press. (mT) | ICP (kW) | DC (kW) | N2 Flow (sccm) | Bias (W) | D/T (sec) | GD (nm) | BSP (T) | Gap (mm) |
|---|---|---|---|---|---|---|---|---|---|
| TaN LND | 5 | 5.25 | 1.6 | 23 | 200 | 4 | 3 | 6 | 200 |
| Ta NND | 5 | 5.25 | 3.3 | 0 | 850 | 11 | 11 (2.5) | 6 | 252 |
| TaLND | 5 | 5.25 | 1 | 0 | 200 | 11.1 | 2 | 6 | 252 |

High and low pressure NND processes can also be performed in the same processing chamber or another processing chamber coupled to a common transfer system. For example, LND process recipes may be as shown in Table 2a, Table 2b, Table 2c, and Table 2d.

TABLE 2a

|  | Press. (mT) | ICP (kW) | DC (kW) | Bias (W) | D/T (sec) | GD (nm) | BSP (T) | Gap (mm) | Dep Mode |
|---|---|---|---|---|---|---|---|---|---|
| Cu 1st | 90 | 5.25 | 3.2 | 100 | 6 × 10 | 6.8 | 8 | 255 | NND(−30 C.) |
| Cu 2nd | 90 | 5.25 | 3.2 | 100 | 2400 | 272 | 0 | 255 | NND(−30 C.) |

TABLE 2b

|  | Press. (mT) | ICP (kW) | DC (kW) | Bias (W) | D/T (sec) | GD (nm) | BSP (T) | Dep Mode |
|---|---|---|---|---|---|---|---|---|
| Cu 1st | 90 | 5.25 | 3.2 | 100 | 6 × 10 | 6.8 | 8 | NND (−30 C.) |
| Cu 2nd | 90 | 5.25 | 3.2 | 100 | 600 | 68 | 0 | NND (−30 C.) |

TABLE 2c

| | Press. (mT) | ICP (kW) | DC (kW) | Bias (W) | D/T (sec) | GD (nm) | BSP (T) | Gap (mm) | Dep Mode |
|---|---|---|---|---|---|---|---|---|---|
| Cu 1st | 50 | 5.25 | 1.4 | 410 | 6 × 10 | 7 | 8 | 255 | NND(−30 C.) |
| Cu 2nd | 50 | 5.25 | 0.7_0 | 410 | 1200_1800 | 70 | 1 | 255 | NND(−30 C.) |

In this example, the Cu $1^{st}$ process included a 10-second continuous dry-filling cycle followed by a 10 second off cycle, and the Cu $2^{nd}$ process included a thirty second continuous dry-filling cycle, a forty-five second shaping plasma process followed by a twenty-five second off cycle.

TABLE 2d

| | Press. (mT) | ICP (kW) | DC (kW) | Bias (W) | D/T (sec) | GD (nm) | BSP (T) | Dep Mode |
|---|---|---|---|---|---|---|---|---|
| Cu 1st | 50 | 5.25 | 1.4 | 410 | 6 × 10 | 7 | 8 | NND(−30 C.) |
| Cu 2nd | 50 | 5.25 | 0.7_0 | 410 | 600_900 | 35 | 1 | NND(−30 C.) |

Multi-step dry-filling processes can be performed in the same processing chamber or another processing chamber coupled to a common transfer system. For example, multi-step process recipes for dry-filling copper may be as shown in Table 3a, Table 3b, and Table 3c.

TABLE 3a

| Step | DCP (kW) | ICP (kW) | TBP (W) | Press (mT) | Gap (mm) | BSP (T) | Cyc D/T (sec) | GD (nm) |
|---|---|---|---|---|---|---|---|---|
| 1 | 1.4 | 5.25 | 410 | 50 | 255 | 8 | 6 × 10 s | 8 |
| 2 | 1.4/0 | 5.25 | 410/410 | 50 | 255 | 1 | 6 × 25/60 s | 20 |
| 3 | 1.4/0 | 5.25 | 410/103 | 50 | 255 | 0 | 15 × 30/60 s | 60 |

TABLE 3b

| Step | DCP (kW) | ICP (kW) | TBP (W) | Press (mT) | Gap (mm) | BSP (T) | Cyc D/T (sec) | GD (nm) |
|---|---|---|---|---|---|---|---|---|
| 1 | 0.75 | 5.25 | 850 | 50 | 200 | 8 | 6 × 10 s | 6 |
| 2 | .75/0 | 5.25 | 850/850 | 50 | 200 | 1 | 6 × 25/60 s | 15 |
| 3 | .75/0 | 5.25 | 850/200 | 50 | 200 | 0 | 14 × 30/60 s | 42 |

TABLE 3c

| Step | DCP (kW) | ICP (kW) | TBP (W) | Press (mT) | Gap (mm) | BSP (T) | Cyc D/T (sec) | GD (nm) |
|---|---|---|---|---|---|---|---|---|
| 1 | 0.75 | 5.25 | 850 | 50 | 200 | 8 | 6 × 10 s | 6 |
| 2 | .75/0 | 5.25 | 850/850 | 50 | 200 | 1 | 6 × 25/60 s | 15 |
| 3 | .75/0 | 5.25 | 850/200 | 50 | 200 | 0 | 14 × 30/60 s | 42 |

In other embodiments, the additional process can include performing a LND process, and the LND process can be performed in the same processing chamber. Alternately, the additional process can be performed in a different processing chamber, such as PVD chambers, CVD chambers, and PECVD chambers. A chamber pressure, chamber temperature, substrate temperature, a process gas chemistry, a process gas flow rate, a target material, an ICP power, substrate position, a target power, a RF bias power, a process time, or a combination thereof can be adjusted to perform a LND process. The process parameters can be adjusted to provide a sputtering value in a range below a sputtering threshold during the LND process. For example, a controller can be used, and the RF bias power and the LND target power can be adjusted to achieve an ultra-low deposition rate in the field area of the patterned substrate, the ultra-low deposition rate can be less than 30 nm/min.

As the dry-filling processes are performed, metal can be deposited into and/or removed from nano-sized features of the patterned substrate while producing substantially no overhanging material at openings of the features.

During processing, a DC-on process may add a small amount of material on the field area on the top surface of the substrate, and a shaping plasma process may be used to remove material on the field area of the substrate, and thus there is substantially no net deposition at the end of the dry-filling process cycle on the field area of the substrate. In addition, during processing, a DC-on process may add a substantially small amount of material to the openings of the nano-sized features on the substrate and a shaping plasma process may be used to remove material from the openings of the nano-sized features on the substrate, and thus there are no voids in the metal deposited into the nano-sized features on the substrate.

In the metallization of high aspect ratio via holes and trenches on semiconductor substrates, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization.

Although only certain embodiments of this invention have been described in detail above, those skilled in the art will readily appreciate that many modifications are possible in the embodiments without materially departing from the novel

What is claimed is:

1. A method of filling nano-sized features of a patterned substrate with metal using an Ionized Physical Vapor Deposition (IPVD) system, the method comprising:
    positioning the patterned substrate in a processing chamber on a substrate holder having a backside gas heating assembly coupled thereto;
    establishing a first substrate temperature at a first temperature of between approximately 50 degrees Celsius and approximately 250 degrees Celsius by controlling the backside gas heating assembly and a first thermal conductivity value between the patterned substrate and the substrate holder to establish a first substrate holder temperature at said first temperature;
    depositing the metal onto the patterned substrate by exposing the patterned substrate to a first dry-filling plasma during a first dry-filling time while maintaining the patterned substrate's temperature at said first temperature by controlling the fast-reacting backside gas heating assembly and the first thermal conductivity value to maintain the substrate holder temperature at said first temperature;
    extinguishing the first dry-filling plasma during a first shutdown time;
    establishing a second substrate temperature at a second temperature by controlling the backside gas heating assembly and a second thermal conductivity value different than the first conductivity value between the patterned substrate and the substrate holder to establish a second substrate holder temperature at said second temperature, wherein the backside gas heating assembly is operable to establish the second substrate holder temperature during a time that is substantially similar to the first shutdown time;
    exposing the patterned substrate to a second dry-filling plasma during a second dry-filling time while maintaining the patterned substrate's temperature at said second temperature;
    extinguishing the second dry-filling plasma during a second shutdown time; and
    removing the patterned substrate from the processing chamber;
the method further comprising:
    establishing the first thermal conductivity value by providing a first backside gas pressure between the patterned substrate and the substrate holder when creating the first dry-filling plasma, wherein the first backside gas pressure is established between approximately 0 Torr and approximately 10 Torr; and
    establishing the second thermal conductivity value by providing a second backside gas pressure between the patterned substrate and the substrate holder when creating the second dry-filling plasma, wherein the second backside gas pressure is different than the first backside gas pressure and is established between approximately 0 Torr and approximately 8 Torr; and
    changing the first thermal conductivity value by cycling the first backside gas during the first dry-filling time, wherein the first backside gas pressure is cycled between a first pressure value and a second pressure value, the first pressure value being between approximately 0 Torr and approximately 10 Torr and the second pressure value being between approximately 2 Torr and approximately 10 Torr.

2. A method of filling nano-sized features of a patterned substrate with metal using an Ionized Physical Vapor Deposition (IPVD) system, the method comprising:
    positioning the patterned substrate in a processing chamber on a substrate holder having a backside gas heating assembly coupled thereto;
    establishing a first substrate temperature at a first temperature of between approximately 50 degrees Celsius and approximately 250 degrees Celsius by controlling the backside gas heating assembly and a first thermal conductivity value between the patterned substrate and the substrate holder to establish a first substrate holder temperature at said first temperature;
    depositing the metal onto the patterned substrate by exposing the patterned substrate to a first dry-filling plasma during a first dry-filling time while maintaining the patterned substrate's temperature at said first temperature by controlling the fast-reacting backside gas heating assembly and the first thermal conductivity value to maintain the substrate holder temperature at said first temperature;
    extinguishing the first dry-filling plasma during a first shutdown time;
    establishing a second substrate temperature at a second temperature by controlling the backside gas heating assembly and a second thermal conductivity value different than the first conductivity value between the patterned substrate and the substrate holder to establish a second substrate holder temperature at said second temperature, wherein the backside gas heating assembly is operable to establish the second substrate holder temperature during a time that is substantially similar to the first shutdown time;
    exposing the patterned substrate to a second dry-filling plasma during a second dry-filling time while maintaining the patterned substrate's temperature at said second temperature;
    extinguishing the second dry-filling plasma during a second shutdown time; and
    removing the patterned substrate from the processing chamber;
the method further comprising:
    establishing the first thermal conductivity value by providing a first backside gas pressure between the patterned substrate and the substrate holder when creating the first dry-filling plasma, wherein the first backside gas pressure is established between approximately 0 Torr and approximately 10 Torr; and
    establishing the second thermal conductivity value by providing a second backside gas pressure between the patterned substrate and the substrate holder when creating the second dry-filling plasma, wherein the second backside gas pressure is different than the first backside gas pressure and is established between approximately 0 Torr and approximately 8 Torr; and
    changing the second thermal conductivity value by cycling the second backside gas during the second dry-filling time, wherein the second backside gas pressure is cycled between a first pressure value and a second pressure value, the first pressure value being between approximately 0 Torr and approximately 8 Torr and the second pressure value being between approximately 2 Torr and approximately 10 Torr.

3. A method of filling nano-sized features of a patterned substrate with metal using an Ionized Physical Vapor Deposition (IPVD) system, the method comprising:

positioning the patterned substrate in a processing chamber on a substrate holder having a backside gas heating assembly coupled thereto;

establishing a first substrate temperature at a first temperature of between approximately 50 degrees Celsius and approximately 250 degrees Celsius by controlling the backside gas heating assembly and a first thermal conductivity value between the patterned substrate and the substrate holder to establish a first substrate holder temperature at said first temperature;

depositing the metal onto the patterned substrate by exposing the patterned substrate to a first dry-filling plasma during a first dry-filling time while maintaining the patterned substrate's temperature at said first temperature by controlling the fast-reacting backside gas heating assembly and the first thermal conductivity value to maintain the substrate holder temperature at said first temperature;

extinguishing the first dry-filling plasma during a first shutdown time;

establishing a second substrate temperature at a second temperature by controlling the backside gas heating assembly and a second thermal conductivity value different than the first conductivity value between the patterned substrate and the substrate holder to establish a second substrate holder temperature at said second temperature, wherein the backside gas heating assembly is operable to establish the second substrate holder temperature during a time that is substantially similar to the first shutdown time;

exposing the patterned substrate to a second dry-filling plasma during a second dry-filling time while maintaining the patterned substrate's temperature at said second temperature;

extinguishing the second dry-filling plasma during a second shutdown time; and removing the patterned substrate from the processing chamber;

wherein the IPVD system comprises an electrostatic chuck (ESC) coupled to the substrate holder and a control unit coupled to the ESC, and the method further comprises:

applying a first clamping voltage to the ESC while establishing of the first substrate temperature, wherein the first clamping voltage is between −2000 V and approximately 2000 V, and applying a second clamping voltage to the ESC while establishing of the second substrate temperature, wherein the second clamping voltage is between −2000 V and approximately 2000 V;

creating a shaping plasma after extinguishing the first dry-filling plasma and/or after extinguishing the second dry-filling plasma; and establishing a third thermal conductivity value by providing a third backside gas pressure between the patterned substrate and the substrate holder when creating the shaping plasma, wherein the third backside pressure is established between approximately 0 Torr and approximately 5 Torr; and changing the third thermal conductivity value by cycling the third backside gas while the shaping plasma is created, wherein the third backside gas pressure is cycled between a first pressure value and a second pressure value, the first pressure value being between approximately 0 Torr and approximately 8 Torr and the second pressure value being between approximately 1 Torr and approximately 3 Torr.

4. A method of filling nano-sized features of a patterned substrate with metal using an Ionized Physical Vapor Deposition (IPVD) system, the method comprising:

positioning the patterned substrate in a processing chamber on a substrate holder having a backside gas heating assembly coupled thereto;

establishing a first substrate temperature at a first temperature of between approximately 50 degrees Celsius and approximately 250 degrees Celsius by controlling the backside gas heating assembly and a first thermal conductivity value between the patterned substrate and the substrate holder to establish a first substrate holder temperature at said first temperature;

depositing the metal onto the patterned substrate by exposing the patterned substrate to a first dry-filling plasma during a first dry-filling time while maintaining the patterned substrate's temperature at said first temperature by controlling the fast-reacting backside gas heating assembly and the first thermal conductivity value to maintain the substrate holder temperature at said first temperature;

extinguishing the first dry-filling plasma during a first shutdown time;

establishing a second substrate temperature at a second temperature by controlling the backside gas heating assembly and a second thermal conductivity value different than the first conductivity value between the patterned substrate and the substrate holder to establish a second substrate holder temperature at said second temperature, wherein the backside gas heating assembly is operable to establish the second substrate holder temperature during a time that is substantially similar to the first shutdown time;

exposing the patterned substrate to a second dry-filling plasma during a second dry-filling time while maintaining the patterned substrate's temperature at said second temperature;

extinguishing the second dry-filling plasma during a second shutdown time; and removing the patterned substrate from the processing chamber;

the method further comprising:

establishing a third substrate temperature between approximately 150 degrees Celsius and approximately 350 degrees Celsius by establishing a third substrate holder temperature between approximately 150 degrees Celsius and approximately 350 degrees Celsius;

maintaining the patterned substrate's temperature between approximately 150 degrees Celsius and approximately 350 degrees Celsius by maintaining the substrate holder's temperature between approximately 150 degrees Celsius and approximately 350 degrees Celsius during a third dry-filling time;

wherein the IPVD system comprises a controller coupled to the backside gas heating assembly, an electrostatic chuck (ESC) coupled to the substrate holder and a control unit coupled to the ESC, and the method further comprises:

establishing a third thermal conductivity value by providing a third backside gas between the patterned substrate and the substrate holder while creating a shaping plasma, wherein a third backside pressure is established between approximately 0 Torr and approximately 5 Torr, and applying a third clamping voltage to the ESC while providing the third backside gas between the patterned substrate and the substrate holder, wherein the third clamping voltage is between −2000 V and approximately 2000 V; and changing the third thermal conductivity value by cycling the third backside gas during the third dry filling time, wherein the third backside gas pressure is cycled between a first pressure value and a second pressure value, the first pressure value being between approximately 0 Torr and approximately 8 Torr and the second pressure value being between approximately 1 Torr and approximately 3 Torr.

* * * * *

UNITED STATES PATENT AND TRADEMARK OFFICE
CERTIFICATE OF CORRECTION

PATENT NO. : 7,618,888 B2 Page 1 of 1
APPLICATION NO. : 11/389511
DATED : November 17, 2009
INVENTOR(S) : Frank M. Cerio, Jr.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 570 days.

Signed and Sealed this

Twenty-sixth Day of October, 2010

David J. Kappos
*Director of the United States Patent and Trademark Office*